US011043621B2

(12) United States Patent
Aihara et al.

(10) Patent No.: US 11,043,621 B2
(45) Date of Patent: Jun. 22, 2021

(54) LIGHT EMITTING DEVICE AND METHOD OF MANUFACTURING LIGHT EMITTING DEVICE

(71) Applicant: NICHIA CORPORATION, Anan (JP)

(72) Inventors: Masato Aihara, Komatsushima (JP); Kenji Ozeki, Tokushima (JP); Atsushi Kojima, Tokushima (JP); Chinami Nakai, Anan (JP); Kazuya Tamura, Anan (JP)

(73) Assignee: NICHIA CORPORATION, Anan (JP)

( * ) Notice: Subject to any disclaimer, the term of this patent is extended or adjusted under 35 U.S.C. 154(b) by 90 days.

(21) Appl. No.: 16/506,125

(22) Filed: Jul. 9, 2019

(65) Prior Publication Data

US 2020/0013936 A1 Jan. 9, 2020

(30) Foreign Application Priority Data

Jul. 9, 2018 (JP) .............................. JP2018-129631
Jun. 6, 2019 (JP) .............................. JP2019-105851

(51) Int. Cl.
*H01L 33/60* (2010.01)
*H01L 25/075* (2006.01)
*H01L 33/62* (2010.01)
*H01L 33/64* (2010.01)

(52) U.S. Cl.
CPC .......... *H01L 33/60* (2013.01); *H01L 25/0753* (2013.01); *H01L 33/62* (2013.01); *H01L 33/647* (2013.01); *H01L 2933/0058* (2013.01); *H01L 2933/0066* (2013.01); *H01L 2933/0075* (2013.01)

(58) Field of Classification Search
CPC .. H01L 25/0756; H01L 33/62; H01L 2933/58
USPC .......................................................... 257/89
See application file for complete search history.

(56) References Cited

U.S. PATENT DOCUMENTS

| 2012/0112623 A1 | 5/2012 | Kobashi |
| 2013/0188381 A1 | 7/2013 | Kotani |
| 2014/0361324 A1 | 12/2014 | Ushiyama et al. |

(Continued)

FOREIGN PATENT DOCUMENTS

| JP | 2012114416 A | 6/2012 |
| JP | 2013149906 A | 8/2013 |

(Continued)

*Primary Examiner* — Elias Ullah
(74) *Attorney, Agent, or Firm* — Hunton Andrews Kurth LLP

(57) ABSTRACT

A light emitting device includes: a light emitting element; a first reflecting member containing reflecting particles, and covering the upper surface of a base while exposing a light extraction surface of the light emitting element; a first cover member having a lower concentration of reflecting particles than the first reflecting member and covering the first reflecting member and a portion of lateral surfaces of the light emitting element while exposing the light extraction surface of the light emitting element; a second cover member covering a portion of the lateral surfaces of the light emitting element; a second reflecting member surrounding the second cover member in a top view and contacting the second cover member and the first reflecting member; the second reflecting member having a narrow-width portion being in contact with the first reflecting member and a wide-width portion located above the narrow-width portion in a cross-sectional view.

8 Claims, 14 Drawing Sheets

(56) References Cited

U.S. PATENT DOCUMENTS

| | | |
|---|---|---|
| 2016/0181483 A1 | 6/2016 | Eichenberg et al. |
| 2016/0276557 A1 | 9/2016 | Wada et al. |
| 2017/0154879 A1 | 6/2017 | Ozeki et al. |
| 2017/0154880 A1 | 6/2017 | Ozeki et al. |
| 2018/0138377 A1 | 5/2018 | Senuki et al. |

FOREIGN PATENT DOCUMENTS

| | | |
|---|---|---|
| JP | 2014241341 A | 12/2014 |
| JP | 2016072412 A | 5/2016 |
| JP | 2016178236 A | 10/2016 |
| JP | 2016532898 A | 10/2016 |
| JP | 2017098470 A | 6/2017 |
| JP | 2017108092 A | 6/2017 |
| JP | 2018082197 A | 5/2018 |
| WO | 2017/013870 A1 | 1/2017 |

LIGHT EMITTING DEVICE AND METHOD OF MANUFACTURING LIGHT EMITTING DEVICE

CROSS-REFERENCE TO RELATED APPLICATION

This application claims priority to Japanese Patent Application No. 2018-129631 filed on Jul. 9, 2018, and Japanese Patent Application No. 2019-105851 filed on Jun. 6, 2019, the disclosures of which are hereby incorporated by reference in their entirety.

BACKGROUND

The present disclosure relates to a light emitting device and a method of manufacturing a light emitting device.

In recent years, light emitting devices in which light emitting elements such as light emitting diodes are mounted have been used in various applications, and light emitting devices having higher light extraction efficiency are in demand. For example, Japanese Patent Publication No. 2014-241341 discloses a light emitting device with improved light extraction efficiency in which a filler-containing resin covers the lateral surfaces of the silicon substrate of the semiconductor light emitting element while exposing the upper surface of the semiconductor light emitting element.

SUMMARY

The present disclosure is intended to provide a light emitting device with good light extraction efficiency which includes a filler-containing resin (or reflecting particles-containing member), and a method of manufacturing a light emitting device.

A light emitting device according to certain embodiment of the present disclosure includes a substrate, a first light emitting element, a first reflecting member, a first cover member, a second cover member, and a second reflecting member. The substrate includes a base and wiring portions. The base has an upper surface, and the wiring portions are disposed on the upper surface. The first light emitting element is disposed on the wiring portions. The first light emitting element has an electrode-formed surface facing the wiring portions, a light extraction surface located on an opposite side of the electrode-formed surface, lateral surfaces located between the light extraction surface and the electrode-formed surface, and a pair of electrodes formed on the electrode-formed surface. The first reflecting member contains reflecting particles, and covers the upper surface of the base while exposing the light extraction surface. The first cover member has a lower concentration of the reflecting particles than a concentration of the reflecting particles in the first reflecting member, and covers the first reflecting member and at least a portion of the lateral surfaces of the first light emitting element while exposing the light extraction surface. The second cover member covers at least a portion of the lateral surfaces of the first light emitting element. The second reflecting member surrounds the second cover member in a top view while being in contact with the second cover member and the first reflecting member. The second reflecting member has a narrow-width portion being in contact with the first reflecting member and a wide-width portion located above the narrow-width portion in a cross-sectional view.

A method of manufacturing a light emitting device according to certain embodiment of the present disclosure includes: providing a substrate including a base having an upper surface of the base, and wiring portions disposed on the upper surface; providing a first light emitting element having a light extraction surface, an electrode-formed surface located on the opposite side of the light extraction surface, lateral surfaces located between the light extraction surface and the electrode-formed surface, and a pair of electrodes on the electrode-formed surface; mounting the first light emitting element on the wiring portions so that the electrode-formed surface faces the wiring portions; disposing a reflecting particle-containing member on the upper surface of the base so as to expose at least a portion of the upper surface of the base overlapping the first light emitting element in a top view; and spreading the reflecting particle-containing member on at least a portion of an area of the upper surface of the base where the first light emitting element overlaps by a centrifugal force.

According to embodiments of the present disclosure, a light emitting device with improved light extraction efficiency can be provided.

DETAILED DESCRIPTION

Figure 1A:
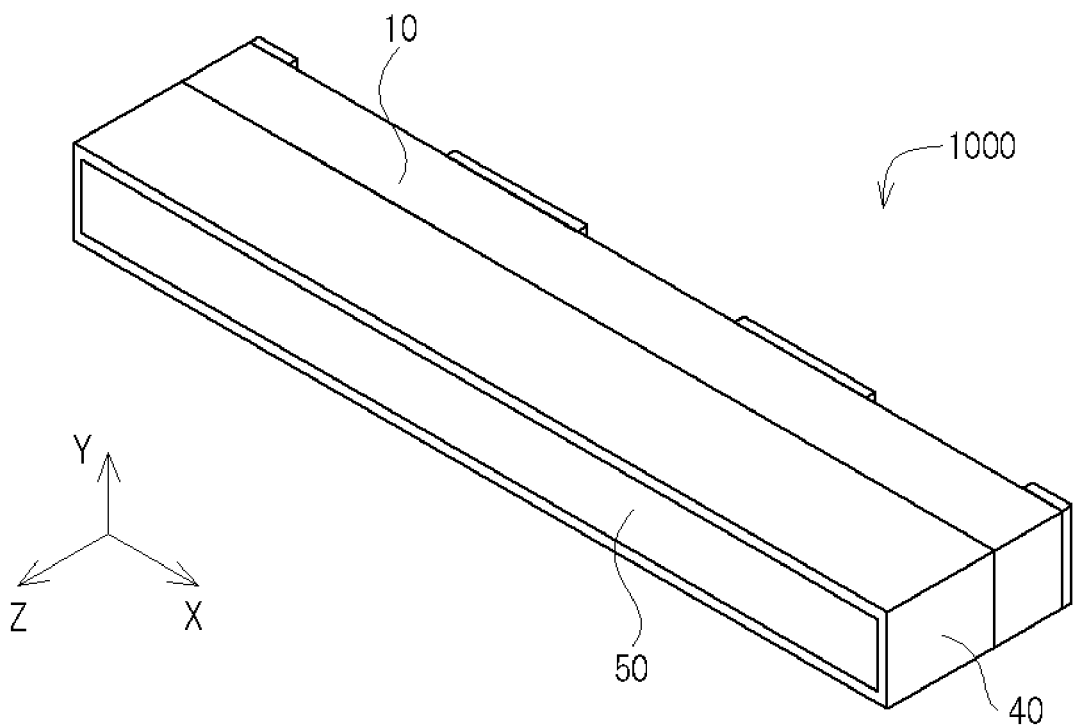
FIG. 1A is a schematic perspective view of the light emitting device according to Embodiment 1.
Figure 1B:
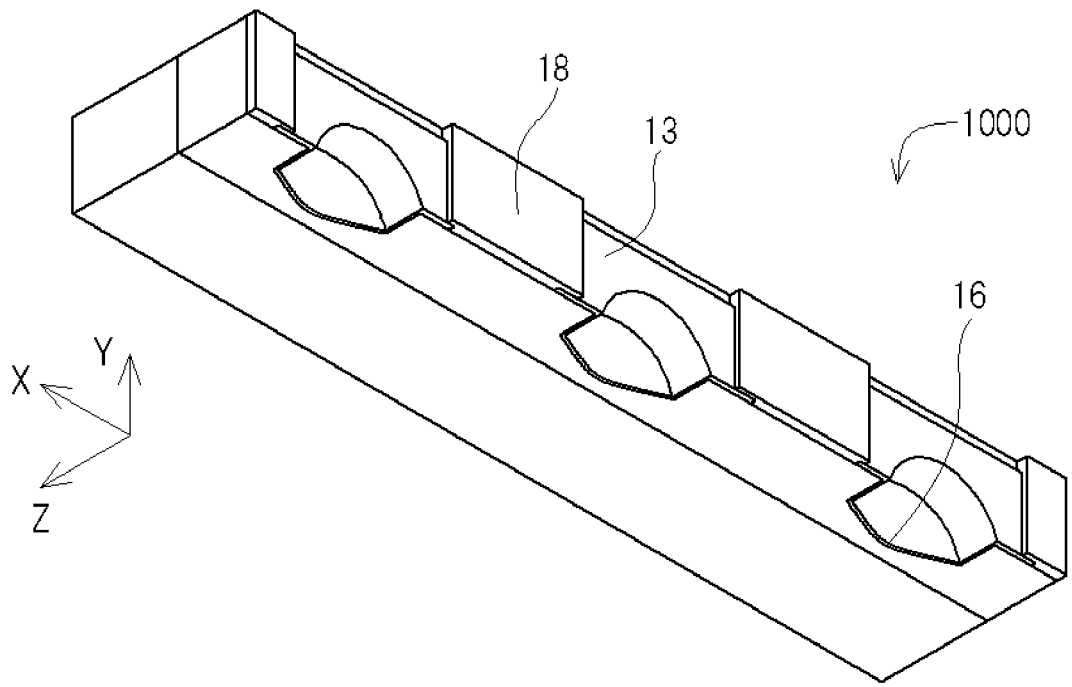
FIG. 1B is another schematic perspective view of the light emitting device according to Embodiment 1.

Certain embodiments of the present disclosure will be explained below with reference to drawings. The light emitting devices explained below, however, are for giving shape to the technical ideals of the present disclosure, and are not intended to limit the present disclosure to those described below unless specifically noted otherwise. What is described in one embodiment is applicable to other embodiments and their variations. Moreover, the sizes and positional relationship of the members shown in the drawings might be exaggerated for clarity of explanation. The same designations and reference numerals show the same members or those having similar characteristics, for which the explanation will be omitted as appropriate.

Embodiment 1

The light emitting device 1000 according to Embodiment 1 of the present disclosure will be explained based on FIG. 1A to FIG. 9. The light emitting device 1000 includes a substrate 10, at least one first light emitting element 20A, a first reflecting member 31, a first cover member 32, a second cover member 33, and a second reflecting member 40. The substrate 10 includes a base 11 which has an upper surface 111, and first wiring portions 12 disposed on the upper surface 111 of the base 11. The first light emitting element 20A has a first light extraction surface 201A, a first electrode-formed surface 203A located on the opposite side of the first light extraction surface, first lateral surfaces 202A located between the first light extraction surface and the first electrode-formed surface, and a pair of first electrodes 21A and 22A on the first electrode-formed surface 203A. The first light emitting element 20A is mounted on the first wiring portions 12 so that the first electrode-formed surface 203A faces the first wiring portions 12. The first light emitting element 20A is electrically connected to the first wiring portions 12. The first reflecting member 31 covers the upper surface 111 of the base 11 while exposing the first light extraction surface 201A. The first reflecting member 31 contains reflecting particles. The first cover member 32 covers at least a portion of the first reflecting member 31 and at least a portion of the first lateral surfaces 202A while exposing the first light extraction surface 201A. The first cover member 32 has a lower concentration of the reflecting particles than that of the first reflecting member 31. The second cover member 33 covers at least a portion of the first lateral surfaces 202A. The second reflecting member 40 surrounds the second cover member 33 in a top view. The second reflecting member 40 is in contact with the second cover member 33 and the first reflecting member 31. In a cross-sectional view, the second reflecting member 40 has a narrow-width portion 42 in contact with the first reflecting member 31 and a wide-width portion 41 located above the narrow-width portion 42. The second light emitting element 20B, the third light emitting element 20C, and the first light emitting element 20A described later might be simply referred to as light emitting elements in some cases.

The first cover member 32 has a higher light transmittance than the first reflecting member 31 because it has a lower concentration of the reflecting particles than that of the first reflecting member 31. Accordingly, by providing the first cover member 32 covering the first lateral surfaces 202A, the light from the first light emitting element 20A can be extracted from the first cover member 32 having a high light transmittance. This can improve the light extraction efficiency of the light emitting device.

By covering the upper surface of the base 11 with the first reflecting member 31 containing reflecting particles and having a high reflectance, the absorption of the light from the first light emitting element 20A by the substrate 10 can be reduced. This can improve the light extraction efficiency of the light emitting device.

For the order of forming the first reflecting member 31 and the first cover member 32, the first reflecting member 31 may be formed before forming the first cover member 32 to cover the first reflecting member 31, or the first reflecting member 31 and the first cover member 32 may be formed in the same processing step. For example, subsequent to forming the first reflecting member 31, the first cover member 32 which has not been cured is disposed on the upper surface of the base by potting, or the like, which is subsequently cured. The first cover member covering the first reflecting member can be formed in this manner. In the case of forming the first reflecting member and the first cover member in the same processing step, for example, a reflecting particle-containing member which has not been cured is disposed on the substrate, and the reflecting particles in the reflecting particle-containing member are settled by a centrifugal force or the like. In the case where the reflecting particles in the reflecting particle-containing member are settled, the reflecting particle-containing member has a reflecting portion and a light transmissive portion. In the reflecting portion, the reflecting particles are localized. The light transmissive portion is located above the reflecting portion, and contains less reflecting particles. In the reflecting particle-containing member, the reflecting portion in which reflecting particles are localized may also be referred to as a first reflecting member 31, and the light transmissive portion which is located above the reflecting portion and contains less reflecting particles may also be referred to as a first cover member 32. In the case of forming a first cover member 31 by settling the reflecting particles in the reflecting particle-containing member, the first cover member 32 may contain reflecting particles which do not settle because of the particle size or the like. Settling the reflecting particles in the reflecting particle-containing member can facilitate reduction of the thickness of the first reflecting member 31. This can facilitate extraction of the light emitted by the first light emitting element 20A from the first cover member 32, thereby improving the light extraction efficiency of the light emitting device. In the case where the reflecting particles of the reflecting particle-containing member are settled, the first reflecting member 31 is the portion of the reflecting particle-containing member containing at least 10 wt % of reflecting particles, and the first cover member 32 is the portion of the reflecting particle-containing member containing less than 10 wt % of reflecting particles. The unit, "wt %," percentage by weight, represents the weight percentage of the reflecting particles relative to the total weight of the reflecting particle-containing member.

The base material for the first cover member 32 simply needs to be a light transmissive material, and known materials such as a silicone resin can be used. The term "light transmissive" refers to a light transmittance at the peak emission wavelength of the first light emitting element, which is preferably at least 60%, more preferably at least 70%, even more preferably at least 80%. In the case of forming the first reflecting member 31 and the first cover member 32 in the same processing step, the reflecting particle-containing member may be formed using a material in which a known light transmissive base material contains reflecting particles. The first reflecting member 31 may be composed of a base material containing reflecting particles. The reflecting particles may be formed using known materials such as titanium oxide or the like. The first reflecting member 31 simply needs to have reflectivity to reflect the light from the first light emitting element, for which a material composed of a base material containing reflecting particles, for example, can be used. The reflectance of the first reflecting member at the emission peak wavelength of the first light emitting element is preferably at least 60%, more preferably at least 70%, even more preferably at least 80%.

The first cover member 32 may be in contact with the second reflecting member 40, but does not have to be in contact with the second reflecting member 40. In the case where the first cover member 32 is in contact with the second reflecting member 40, the area of the first cover member 32 having a high light transmittance can be increased in a top view. This can facilitate the spreading of the light from the first light emitting element 20A in directions X and Y, thereby attenuating luminance non-uniformity of the light emitting device.

Figure 2A:
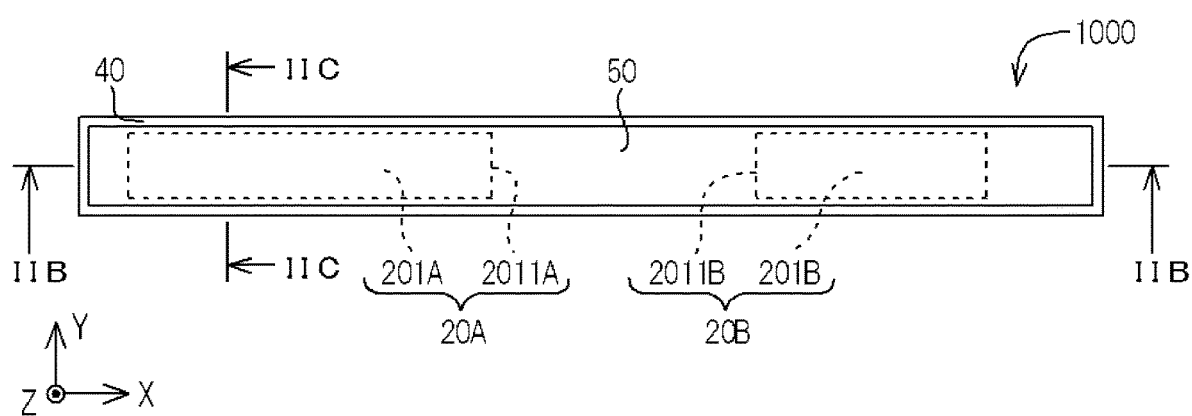
FIG. 2A is a schematic top view of the light emitting device according to Embodiment 1.
Figure 2B:
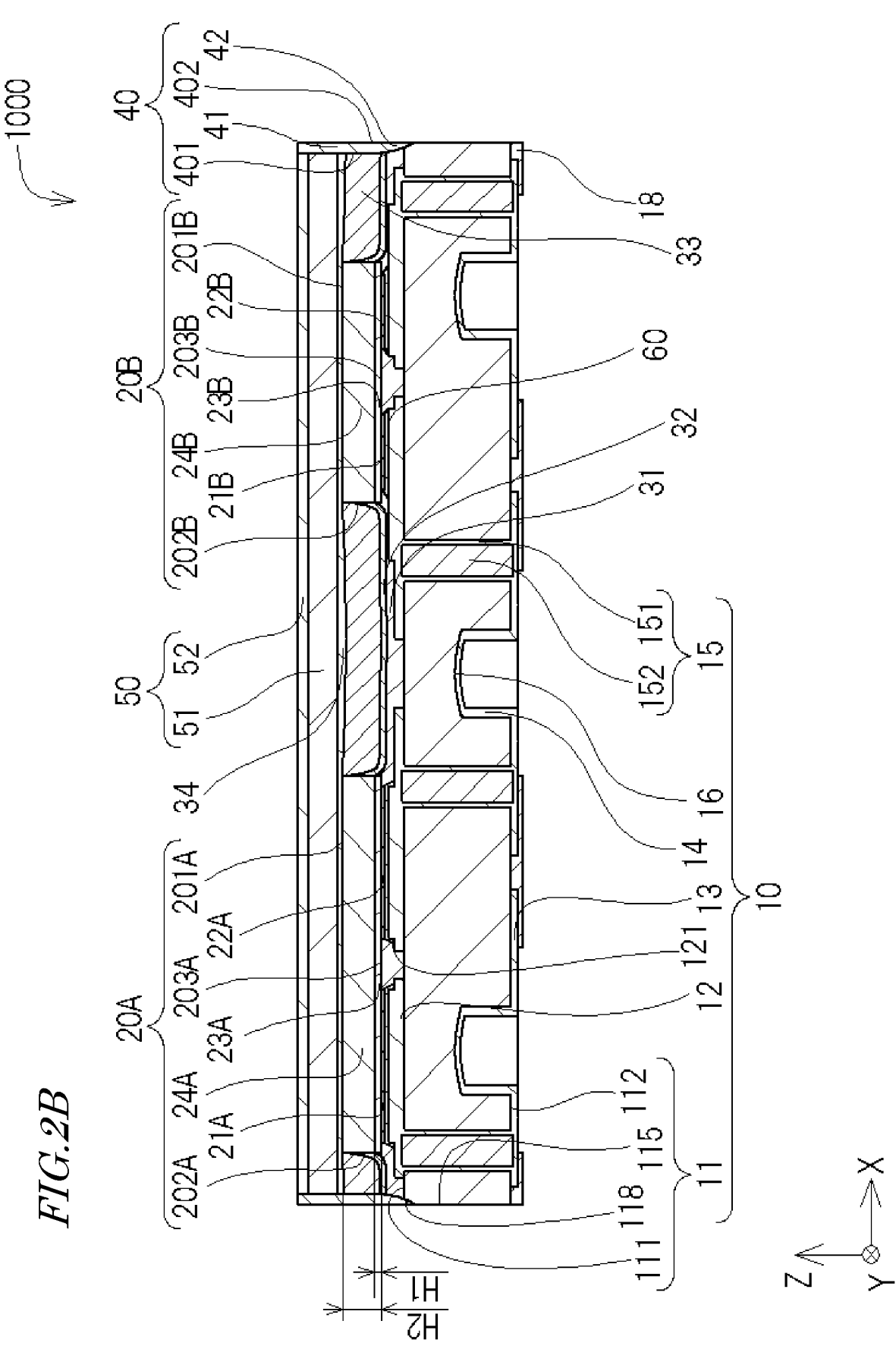
FIG. 2B is a schematic cross-sectional view taken along line IIB-IIB in FIG. 2A.
Figure 2C:
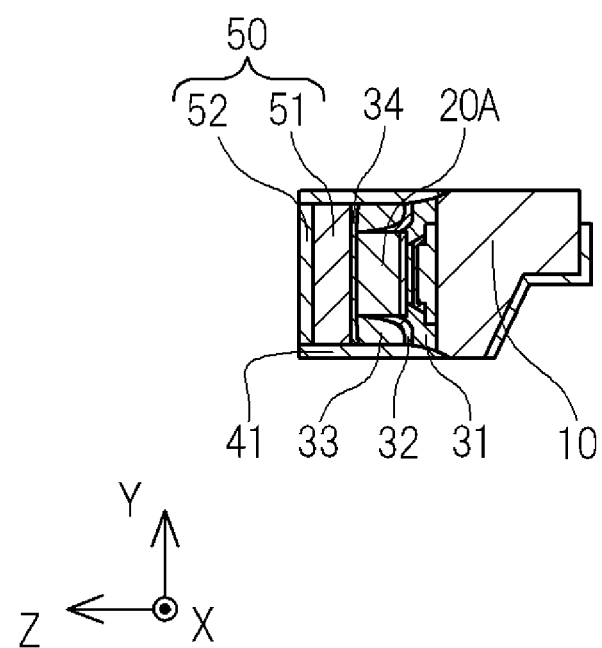
FIG. 2C is a schematic cross-sectional view taken along line IIC-IIC in FIG. 2A.
Figure 3:
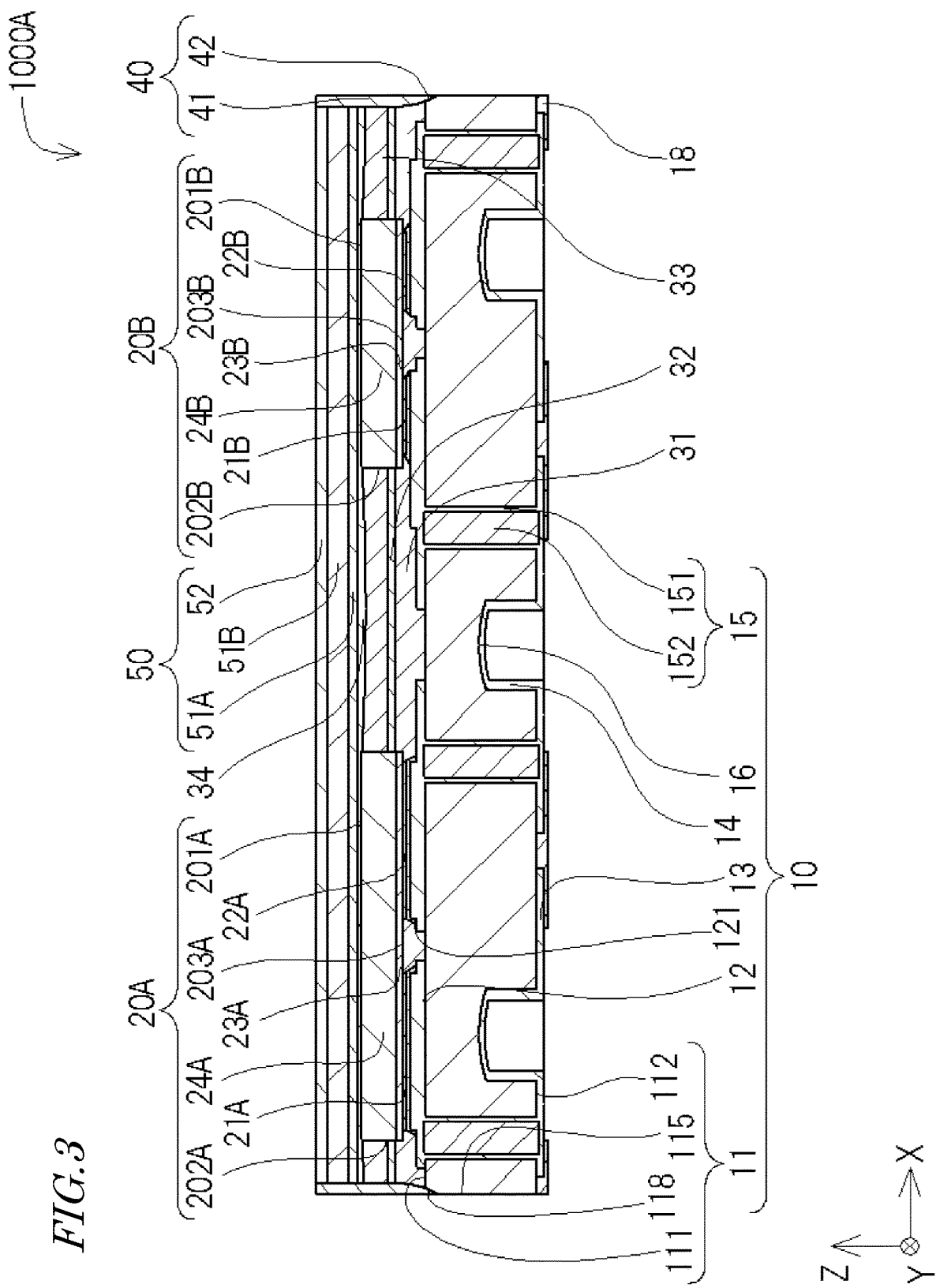
FIG. 3 is a schematic cross-sectional view of a variation of the light emitting device according to Embodiment 1.

As in the case of the light emitting device 1000 shown in FIGS. 2B and 2C, the thickness of the portion of the first cover member 32 that is in contact with the first light emitting element 20A may be greater than the thickness of the portion of the first cover member 32 distant from the first light emitting element 20A. The term "thickness" of the portion of the first cover member 32 refers the length in the direction from the electrode-formed surface toward the light extraction surface of the light emitting element. For example, in the case where the first cover member 32 is in contact with the second reflecting member 40, the thickness of the portion of the first cover member 32 that is in contact with the first light emitting element 20A may be greater than the thickness of the portion of the first cover member 32 that is in contact with the second reflecting member 40. As in the case of the light emitting device 1000A shown in FIG. 3, the upper surface of the first cover member 32 may be flat. In the case where the thickness of the portion of the first cover member 32 that is in contact with the first light emitting element 20A is greater than the thickness of the portion of the first cover member 32 distant from the first light emitting element 20A, the contact areas between the first lateral surfaces 202A and the first cover member 32 can be easily increased. This can facilitate extraction of the light from the first light emitting element 20A from the first cover member 32, thereby improving the light extraction efficiency of the light emitting device. In the case where the upper surface of the first cover member is flat, variability in the shape of the first cover member 32 among light emitting devices can be reduced. This can increase production yield of the light emitting device. The shape of the first cover member 32 can be changed, for example, by adjusting the viscosity of the first cover member and/or the reflecting particle-containing member. In the description herein, the "flat" indicates that tolerance of about ±5 μm is allowed.

The light emitting device may include one light emitting element or, as shown in FIG. 2B, two light emitting elements, which are the first light emitting element 20A and the second light emitting element 20B. In the case where the light emitting device includes a first light emitting element and a second light emitting element, the first cover member 32 is preferably in contact with the first light emitting element 20A and the second light emitting element 20B. In this manner, the light from the first light emitting element and the light from the second light emitting element can travel in the first cover member 32. This, for example, can attenuate luminance reduction between the first light emitting element and the second light emitting element, in the case where the peak emission wavelength of the first light emitting element and the peak emission wavelength of the second light emitting element are the same. Accordingly, luminance non-uniformity of the light emitting device can be attenuated. The peak emission wavelength of the first light emitting element and the peak emission wavelength of the second light emitting element may be different from each other. In this case, color mixing of the light emitting device can be improved because the light from the first light emitting element and the light from the second light emitting element travel in the first cover member. In the description herein, "the peak emission wavelengths being the same" indicates that a tolerance of about ±10 nm is allowed.

The first reflecting member 31 may be in contact with the first light emitting element 20A, but does not have to be in contact with the first light emitting element 20A. As shown in FIG. 2B, in the case where the first reflecting member 31 is in contact with the first light emitting element 20A, the first reflecting member 31 preferably directly covers the pair of first electrodes 21A and 22A. This can reduce the absorption of the light from the first light emitting element 20A by the first electrodes 21A and 22A. In the case where the first reflecting member 31 is in contact with the first light emitting element 20A, the first reflecting member 31 preferably covers the lateral surfaces of the first semiconductor layer 23A of the first light emitting element 20A. This can increase the thickness of the first reflecting member 31 in the Z direction to thereby make it easier for the first reflecting member 31 to cover the first electrodes 21A and 22A.

The first reflecting member 31 may cover the first electrode-formed surface 203A. The first reflecting member 31 may cover the first electrode-formed surface 203A directly or via the first cover member 32. In this manner, the light from the first light emitting element 20A is reflected by the first reflecting member 31, thereby reducing the absorption of the light from the first light emitting element 20A by the substrate 10. Accordingly, the light extraction efficiency of the light emitting device can be improved.

As shown in FIG. 2B, in the case where the light emitting device 1000 includes a first light emitting element 20A and a second light emitting element 20B, the first reflecting member 31 preferably covers the first electrode-formed surface 203A and the second electrode-formed surface 203B. In this manner, the light from the first light emitting element 20A and the light from the second light emitting element 20B are reflected by the first reflecting member 31, so that the light extraction efficiency of the light emitting device can be improved.

In the case where the first reflecting member 31 covers the first lateral surfaces 202A of the first light emitting element 20A, the length H1 where the first reflecting member 31 is in contact with the first lateral surfaces 202A in the Z direction is preferably no more than 0.5 times, more preferably no more than 0.3 times, the length H2 of the first lateral surfaces 202A. This makes it difficult to block the light from the first light emitting element 20A advancing in the X direction and/or the Y direction, so that luminance non-uniformity of the light emitting device can be attenuated.

The maximum thickness of the first reflecting member 31 in the Z direction is preferably, for example, in a range of from 10 µm to 200 µm. A maximum thickness of at least 10 µm can facilitate the formation of the first reflecting member 31. A maximum thickness of 200 µm at most can facilitate the formation of the first reflecting member 31 which does not oppose any portions of the first lateral surfaces of the first light emitting element 20A. This makes it difficult to block the light from the first light emitting element 20A traveling in the X direction and/or the Y direction, so that luminance non-uniformity of the light emitting device can be attenuated.

In the case where the light emitting device includes multiple light emitting elements, the peak emission wavelengths of the light emitting elements may be the same or different. With the light emitting elements each having different peak emission wavelength can improve the color reproducibility of the light emitting device. For example, the first light emitting element 20A may have a peak emission wavelength that is at least 430 nm and less than 490 nm (i.e., wavelength range of the blue region), and the second light emitting element 20B may have a peak emission wavelength that is at least 490 nm and less than 570 nm (i.e., wavelength range of the green region). As an example of the structure of a light emitting element, the first light emitting element 20A will be explained below.

The first light emitting element 20A has a first light extraction surface 201A, a first electrode-formed surface 203A located on the opposite side of the first light extraction surface, and first lateral surfaces 202A located between the first light extraction surface 201A and the first electrode-formed surface 203A. The first lateral surfaces 202A may be perpendicular, inwardly oblique, or outwardly oblique to the first light extraction surface 201A. On the first electrode-formed surface 203A, a pair of first electrodes 21A and 22A is formed.

The first light emitting element 20A includes a first element substrate 24A and a first semiconductor layer 23A formed in contact with the first element substrate 24A. The pair of first electrodes 21A and 22A is electrically connected to the first semiconductor layer 23A. In this embodiment, the first light emitting element 20A includes a first element substrate 24A as an example explanation, but the first element substrate 24A may have been removed.

The shape of the first light emitting element 20A in a top view may be a triangle, rectangle, hexagon, or other shape. As shown in FIG. 2A, in the case where the light emitting device 1000 includes a first light emitting element 20A and a second light emitting element 20B each having a rectangular shape in a top view, the light emitting elements are preferably disposed so that one of the short sides 2011A of the first light extraction surface of the first light emitting element faces one of the short sides 2011B of the second light extraction surface 201B of the second light emitting element. This can reduce the thickness of the light emitting device 1000 in the Y direction.

The first light extraction surface 201A and the second light extraction surface 201B may have substantially the same height or different heights in the Z direction. In a top view, the area of the first light extraction surface 201A and the area of the second light extraction surface 201B may be the same or different. In the case where the light emitting device includes a wavelength conversion material, in particular, the light emitting element having the peak emission wavelength that can easily excite the wavelength conversion material preferably has a larger light extraction surface. A wavelength conversion material absorbs at least a portion of primary light emitted by a light emitting element and emits secondary light having a different wavelength from that of the primary light. For example, a light emitting device includes a manganese-activated potassium fluorosilicate phosphor (e.g., $K_2SiF_6$:Mn), which emit red light, as a wavelength conversion material, the first light emitting element having the peak emission wavelength at least 430 nm and less than 490 nm (i.e., wavelength range of the blue region), and the second light emitting element having the peak emission wavelength at least 490 nm and less than 570 nm (i.e., wavelength range of the green region). In this case, for example, the first light extraction surface 201A of the first light emitting element 20A is preferably larger than the second light extraction surface 201B of the second light emitting element 20B. For example, the area of the first light extraction surface 201A of the first light emitting element 20A is preferably 1.2 to 2 times the area of the second light extraction surface 201B of the second light emitting element 20B. A manganese-activated potassium fluorosilicate phosphor (e.g., $K_2SiF_6$:Mn) is more readily excited by light having the wavelength of 430 nm to 490 nm than light having the wavelength of 490 nm 570 nm. Allowing the first light extraction surface 201A of the first light emitting element to be larger than the second light extraction surface 201B of the second light emitting element can increase the percentage of the light from the first light emitting element 20A, thereby attenuating reduction of the percentage of the light from the first light emitting element 20A relative to the light from the light emitting device even if a portion of the light from the first light emitting element is converted by the manganese-activated potassium fluorosilicate phosphor. This can enhance the color reproducibility of the light emitting device 1000.

The second cover member 33, which is light transmissive, covers at least a portion of the first lateral surfaces 202A. Covering the first lateral surfaces 202A with the second cover member 33 allows the light from the first light emitting element 20A to be extracted from the second cover member 33, thereby improving the light extraction efficiency of the light emitting device. The second cover member 33 may cover the first lateral surfaces 202A directly or via the first cover member 32. Alternatively, the second cover member 33 may have both the portions that directly cover the first lateral surfaces 202A and the portions that cover the first lateral surfaces 202A via the first cover member 32. In the case where the difference in the refractive index between the base material of the first cover member 32 and the first element substrate 24A is smaller than the difference in the refractive index between the base material of the second cover member 33 and the first element substrate 24A, it is preferable for the second cover member 33 to cover the first lateral surfaces 202A, which includes the lateral surfaces of the first element substrate 24A, via the first cover member 32. This can easily increase the contact area between the first cover member 32 and the first element substrate 24A, thereby facilitating extraction of the light emitted by the first light emitting element from the first cover member 32. In the case where the difference in the refractive index between the base material of the first cover member 32 and the first semiconductor layer 23A is smaller than the difference in the refractive index between the base material of the second cover member 33 and the first semiconductor layer 23A, it is preferable for the second cover member 33 to cover at least a portion of the first lateral surfaces 202A, which includes the lateral surfaces of the first semiconductor layer 23A, via the first cover member 32. This allows the light from the first light emitting element to be readily extracted from the first cover member 32.

Figure 4:
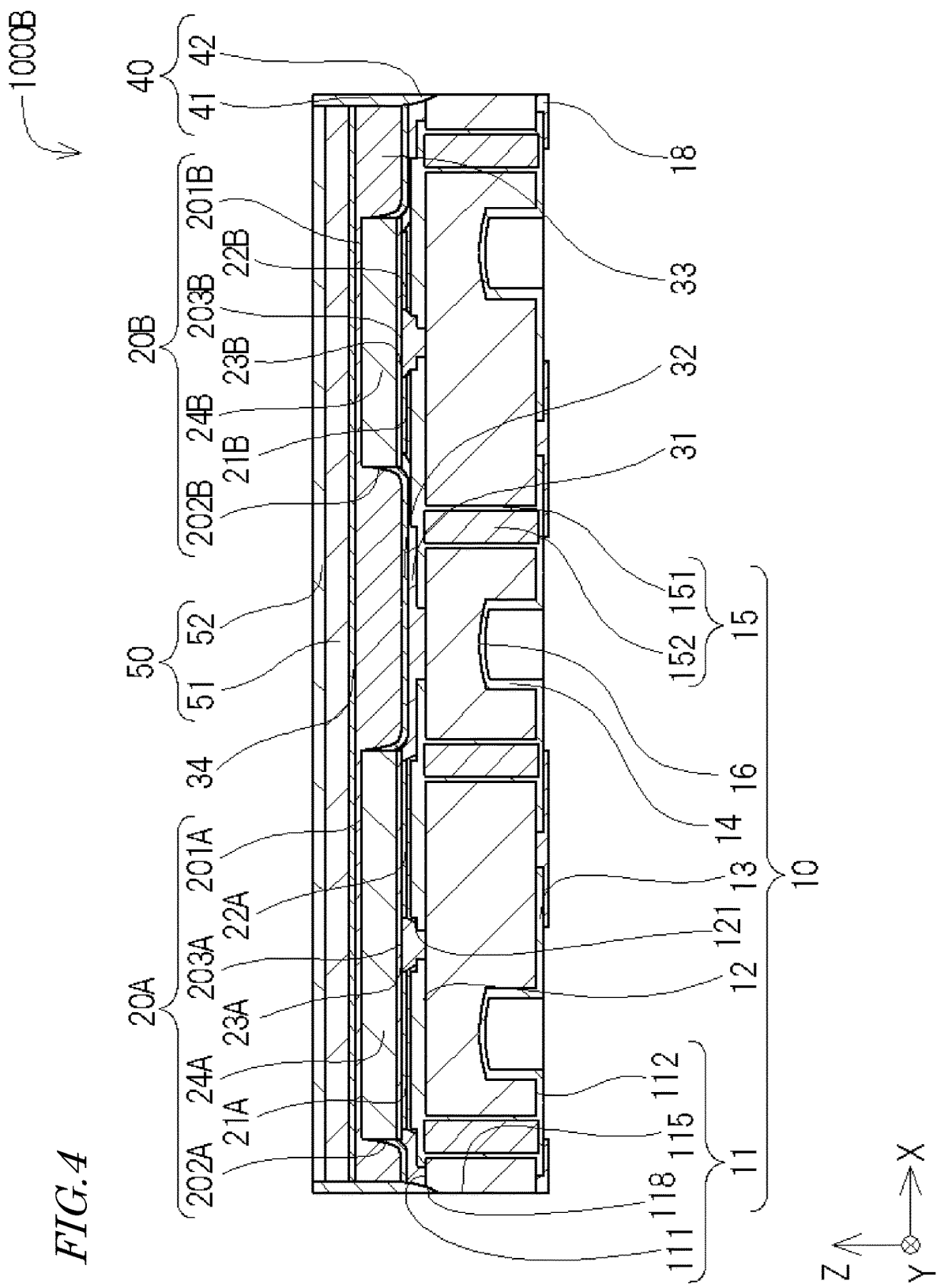
FIG. 4 is a schematic cross-sectional view of another variation of the light emitting device according to Embodiment 1.
Figure 5:
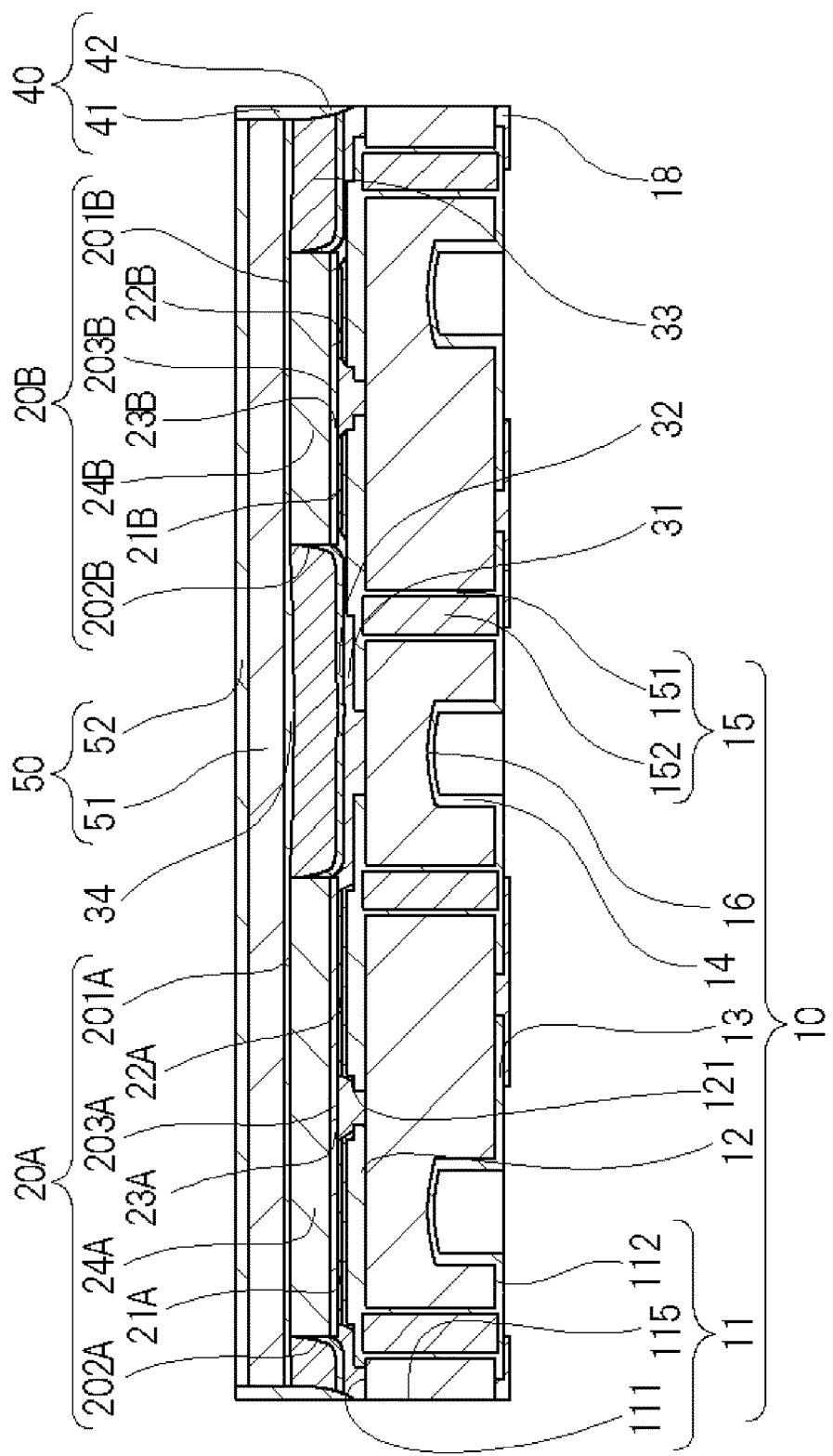
FIG. 5 is a schematic cross-sectional view of still another variation of the light emitting device according to Embodiment 1.

As in the case of the light emitting device 1000B shown in FIG. 4, the second cover member 33 may cover the first light extraction surface 201A, or as in the case of the light emitting device 1000 shown in FIG. 2B, the second cover member 33 may expose the first light extraction surface 201A. In the case where the second cover member 33 covers the first light extraction surface 201A, the first light emitting element 20A can be protected from external forces applied through the first light extraction surface 201A. In the case where the second cover member 33 exposes the first light extraction surface 201A, the thickness of the light emitting device in the Z direction can be reduced, thereby reducing the size of the light emitting device.

In the case where a light emitting device includes a second light emitting element 20B, the second cover member 33 preferably covers the first lateral surfaces 202A and the second lateral surfaces 202B. This allows the light from the first light emitting element 20A and the light from the second light emitting element 20B to readily travel in the second cover member 33. For example, in the case where the first light emitting element and the second light emitting element have the same peak emission wavelength, the luminance non-uniformity between the first light emitting element and the second light emitting element can be attenuated because the light from the first light emitting element and the light from the second light emitting element travels in the second cover member. In the case where the first light emitting element and the second light emitting element have different peak emission wavelengths, color mixing of the light emitting device can be improved because the light from the first light emitting element and the light from the second light emitting element travels in the second cover member. The second cover member may be in contact with the first lateral surfaces and/or the second lateral surfaces, or cover the first lateral surfaces and/or the second lateral surfaces via the first cover member.

The second cover member 33 may contain a wavelength conversion material. This can facilitate color adjustments of the light emitting device. The wavelength conversion material may be uniformly dispersed in the second cover member 33 or localized towards the first cover member rather than the upper surface of the second cover member. Examples of the wavelength conversion material to be contained in the second cover member include a green-light-emitting wavelength conversion material having a peak emission wavelength of at least 490 nm and 570 nm at most, a red-light-emitting wavelength conversion material having a peak emission wavelength of at least 610 nm and 750 nm at most, or the like. The second cover member may contain one or more types of wavelength conversion materials. For example, the light guide member may contain a green-light-emitting wavelength conversion material and a red-light-emitting wavelength conversion material. Examples of green-light-emitting wavelength conversion materials include β-SiAlON phosphors (e.g., $Si_{6-z}Al_zO_zN_{8-z}$:Eu (0<z<4.2)). Examples of red-light-emitting wavelength conversion materials include manganese-activated potassium fluorosilicate phosphors (e.g., $K_2SiF_6$:Mn).

The second reflecting member 40 surrounds the second cover member 33 while being in contact with the second cover member 33 and the first reflecting member 31 in a top view. The second reflecting member 40 has a narrow-width portion 42 in contact with the first reflecting member 31, and a wide-width portion 41 located above the narrow-width portion 42 in a cross-sectional view. The second reflecting member 40 has an inner lateral surface 401 and an outer lateral surface 402. The narrow-width portion 42 or the wide-width portion 41 means the shortest distance between the inner lateral surface 401 and the outer lateral surface 402.

The second reflecting member 40 has a quadrangular annular shape in a top view. By surrounding the second cover member 33 with the second reflecting member 40, the light from the first light emitting element 20A traveling in the X direction and/or the Y direction can be reflected by the second reflecting member 40 to thereby increase the light traveling in the Z direction.

For the second reflecting member 40, for example, known materials can be used, such as a resin base material containing reflecting particles. The second reflecting member 40 may be formed by, for example, creating a groove in the first reflecting member 31 and the second cover member 33, supplying an uncured resin material to-be the second reflecting member in the groove, and curing the second reflecting member. For example, by using a blade having a narrow-width portion and a wide-width portion, the groove formed by the blade can also have a narrow-width portion and a wide-width portion. The tip of the blade is the narrow-width portion. A groove can be created in the first reflecting member 31 and the second cover member 33 more easily with a blade having a narrow tip than a blade having a constant width.

The narrow-width portion 42 of the second reflecting member 40 is in contact with the first reflecting member 31. This can attenuate the light from the first light emitting element 20A to transmit through the narrow-width portion 42 of the second reflecting member 40 which has the small thickness. This can improve the light extraction efficiency of the light emitting device.

In a top view, the width of the wide-width portion 41 of the second reflecting member 40 is preferably in a range of from 10 μm to 50 μm. The first reflecting member having a width of 50 μm at most can reduce the size of the light emitting device. The first reflecting member having a width of at least 10 μm can attenuate the light from the first light emitting element to transmit through the wide-width portion 41 of the second reflecting member 40.

The substrate 10 has a base 11 and first wiring portions 12. The base 11 has an upper surface 111, a lower surface 112 located on the opposite side of the upper surface, a rear face 113 contiguous with and at right angle to the upper surface 111, and a front face 114 positioned on the opposite side of the rear face 113. The base 11 also has lateral surfaces 115 between the upper surface 111 and the lower surface 112.

The base 11, in particular, is preferably formed with a material having a physical property such that the coefficient of linear expansion is similar to that of the first light emitting element 20A, for example, an insulating material, such as a resin or fiber reinforced resin, ceramic, glass or the like. Examples of the resin or fiber-reinforced resin include epoxy, glass epoxy, bismaleimide triazine (BT), polyimide, or the like. Examples of the ceramic include aluminum oxide, aluminum nitride, zirconium oxide, zirconium nitride, titanium oxide, titanium nitride, or a combination.

The lower limit of the thickness of the substrate 11 is preferably at least 0.05 mm, more preferably at least 0.2 mm, from a strength standpoint. The upper limit of the thickness of the substrate 11 is preferably 0.5 mm at most, more preferably 0.4 mm at most, from the standpoint of the thickness (i.e., depth) of the light emitting device.

As shown in FIG. 2B, the substrate 10 may include second wiring portions 13 disposed on the lower surface 112. In the case where the substrate 10 includes first wiring portions 12 and second wiring portions 13, the substrate 10 may include vias 15 for connecting the first wiring portions 12 and the second wiring portions 13. The vias 15 are preferably circular shaped in a top view. In this way, they can be easily formed using a drill or the like. In the case where the vias 15 are circular in shape in a top view, the diameter of one of the vias is preferably 100 µm to 150 µm. A via having a diameter of at least 100 µm can improve the heat dissipation of the light emitting device, and a via having a diameter of 150 µm at most can attenuate the strength decline of the base. In the description herein, a circular shape is not limited to a true circle, but includes similar shapes, for example, an elliptical shape, or a shape created by rounding four corners of a quadrangle into arcs.

The vias 15 may be structured by filling through holes of the base 11 with a conductive material, and may include, as shown in FIG. 2B, fourth wiring portions 151 covering the surfaces of the through holes of the base 11 and fillings 152 filling the spaces surrounded by the fourth wiring portions 151. The fillings 152 may be formed of a conductive or insulating material. It is preferable to use a resin material for the fillings 152. It is easier to fill the fourth wiring portions 151 with a resin because a resin material before curing has generally higher fluidity than a metal material before hardening. The use of a resin material for the fillings can facilitate manufacturing of substrates. Examples of resin materials that can easily filling holes include epoxy resins. In the case where using a resin material for the fillings, it is preferable to add a material for reducing the coefficient of linear expansion. This can reduce the difference in the coefficient of linear expansion from that of the fourth wiring portions, thereby reducing a possibility that gaps being created between the fourth wiring portions and the fillings. Examples of the additives include silicon oxide. Using a metal material for the fillings 152 can improve heat dissipation. In the case of structuring the vias by filling the through holes of the base with a conductive material, it is preferable to use a metal material having high thermal conductivity, such as Ag, Cu, or the like.

As shown in FIG. 2B, the first wiring portions 12 preferably each have a projected portion 121 at the positions corresponding to the pair of first electrodes 21A and 22A of the first light emitting element 20A. In other words, the first wiring portions 12 preferably each have the projected portion 121 at the positions overlapping the first electrodes 21A and 22A in a top view. Providing the projected portions 121 to the first wiring portions 12 can facilitate the alignment between the first light emitting element and the substrate by the self-alignment effect in the case where bonding the first wiring portions 12 and the first electrodes 21A and 22A via a conductive adhesive 60. The thickness of the projected portions 121 in the Z direction is preferably 10 µm to 30 µm. The width of the projected portions 121 in the X direction and/or the Y direction may suitably be changed in accordance with the sizes of the corresponding electrodes of the light emitting element.

The conductive adhesive 60 is a material for electrically connecting the pair of first electrodes 21A and 22A of the first light emitting element 20A to the first wiring portions 12. The conductive adhesive 60 may be formed using know materials, for example: bumps formed using gold, silver, copper, or the like; metal paste formed using a resin binder and metal powder of silver, gold, copper, platinum, aluminum, palladium, or the like; tin-bismuth-based, tin-copper-based, tin-silver-based, or gold-tin-based solder; or blazing materials such as low-melting-point metals.

In the case where the light emitting device includes a second light emitting element 20B, the first wiring portions 12 preferably each have another projected portion 121 at the positions corresponding to the pair of electrodes 21B and 22B of the second light emitting element. This can facilitate the alignment between the light emitting element and the substrate by the self-alignment effect.

On the base 11, one or more recesses 16 may be formed to open at the lower surface 112 and the rear face 113 of the base. In other exemplary light emitting devices according to the present disclosure, no recess 16 is formed. The recesses 16 can enhance the bonding strength between the light emitting device 1000 and a mounting substrate. Regardless of whether the light emitting device 1000 is of a top view type where the lower surface 112 of the base 11 faces a mounting substrate, or a side view type where the rear face 113 of the base 11 faces a mounting substrate, the volume of the bonding member may be increased, thereby enhancing the bonding strength with the mounting substrate. The bonding strength between the light emitting device 1000 and a mounting substrate can be enhanced particularly in the case of a side view type. The number of the recess formed on the base may be single or multiple. Multiple recesses can further enhance the bonding strength between the light emitting device 1000 and a mounting substrate.

The maximum depth of a recess 16 in the Z direction is preferably 0.4 to 0.9 times the thickness of the base 11 in the Z direction. The recess having a depth of at least 0.4 times the thickness of the base increases the volume of the bonding member formed in the recess, thereby enhancing the bonding strength between the light emitting device and a mounting substrate. The recess having a depth of less than 0.9 times the thickness of the base can attenuate the strength decline of the base.

Figure 6:
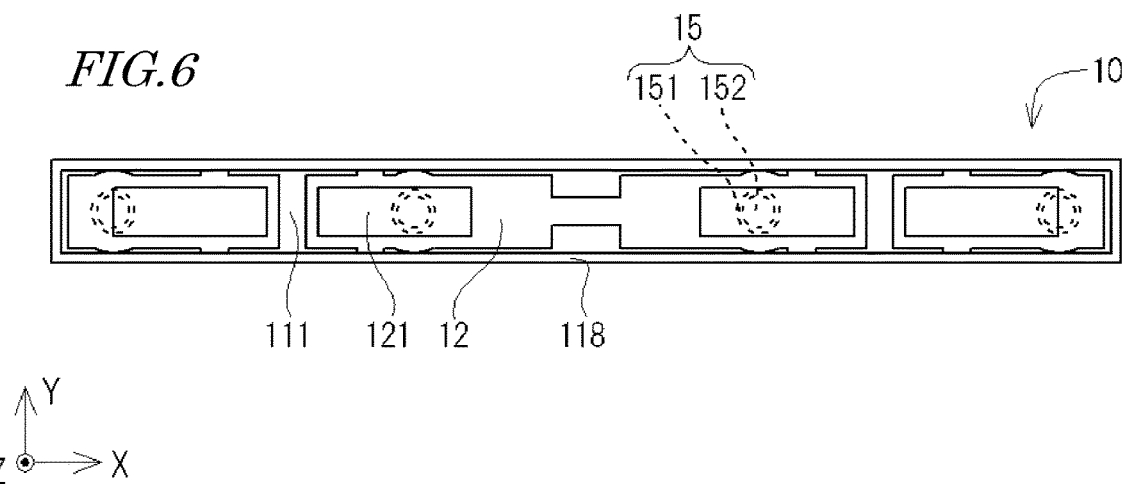
FIG. 6 is a schematic top view of the substrate according to Embodiment 1.

As in the case of the light emitting device 1000 shown in FIG. 2B, on the upper surface 111 of the base 11 a depression 118 is formed. Alternatively, as in the case of the light emitting device 1000C shown in FIG. 5, no depression 118 is formed on the upper surface 111 of the base 11. In the case where the depression 118 is formed on the upper surface 111 of the base 11 a portion of the second reflecting member 40 is preferably disposed in the depression 118. This allows the base 11 to be in direct contact with the second reflecting member 40 thereby improving the bonding strength between the base and the second reflecting member. The depression 118 is preferably formed along the outer perimeter of the upper surface 111 of the base 11 as shown in FIG. 6. This increases the contact area between the base 11 and the second reflecting member 40, thereby enhancing the bonding strength between the base and the second reflecting member 40.

Figure 7:
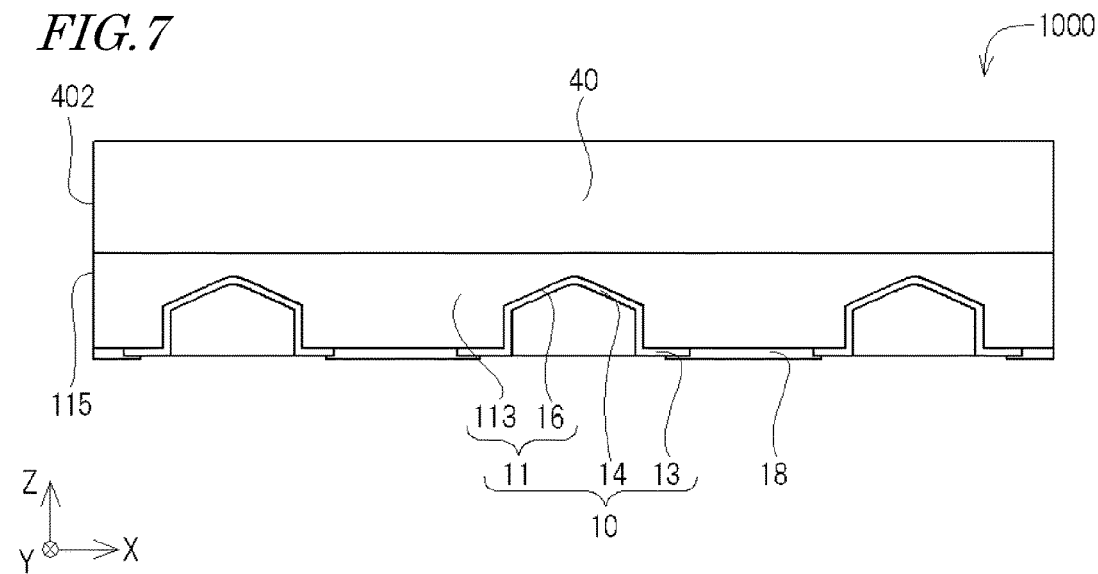
FIG. 7 is a schematic rear view of the light emitting device according to Embodiment 1.
Figure 8:
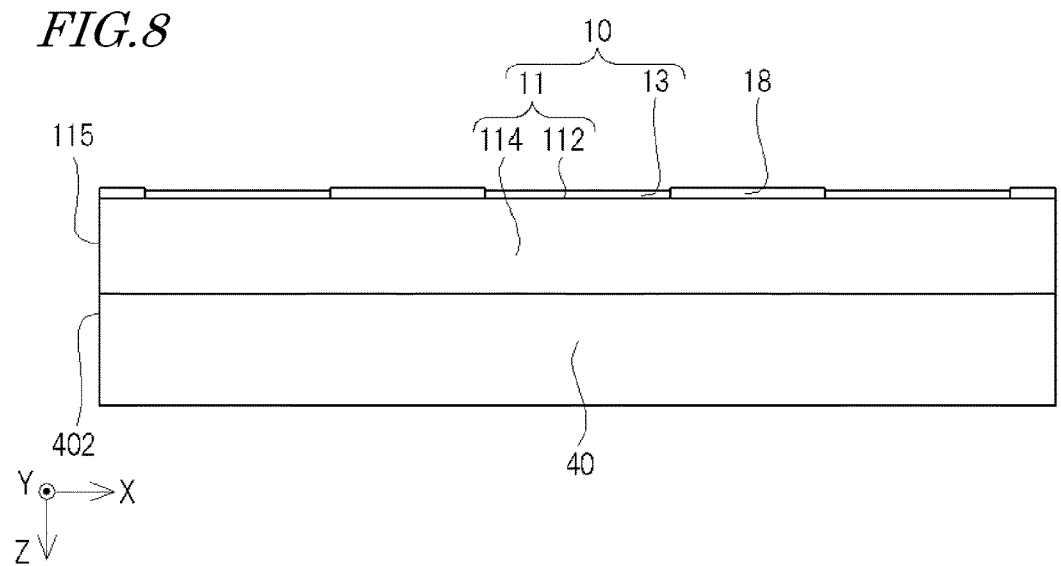
FIG. 8 is a schematic front view of the light emitting device according to Embodiment 1.
Figure 9:
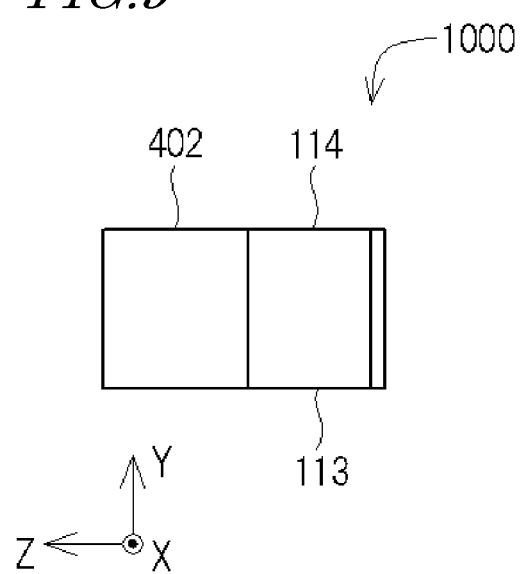
FIG. 9 is a schematic side view of the light emitting device according to Embodiment 1.

As in the case of the light emitting device 1000 shown in FIGS. 7, 8, and 9, the outer edges of the base are preferably flush with the outer lateral surfaces 402 of the second reflecting member. This can facilitate reduction in size of the light emitting device in the X direction and/or the Y direction.

The light emitting device 1000 may include an insulating film 18 covering at least a portion of the second wiring portions 13. Providing an insulating film 18 can ensure insulation and prevent short circuits at the lower surface 112. This can also attenuate delamination of the second wiring portions 13 from the base 11.

The light emitting device may include a light transmitting member 50 covering the first light extraction surface. Covering the first light extraction surface 201A of the first light emitting element with a light transmitting member 50 can protect the first light emitting element 20A against external stress. The light transmitting member 50 may cover the first light extraction surface while being in contact with the first light extraction surface, or may cover the first light extraction surface via the light transmissive adhesive layer 34 as shown in FIG. 2B. In the case where the light emitting device includes a second light emitting element 20B, a single light transmitting member 50 may cover the first light extraction surface 201A and the second light extraction surface 201B. Alternatively, the light emitting device may include multiple light transmitting members. For example, the light emitting device may include a first light transmitting member and a second light transmitting member such that the first light transmitting member covers the first light extraction surface and the second light transmitting member covers the second light extraction surface. In the case where a single light transmitting member 50 covers the first light extraction surface 201A and the second light extraction surface 201B, the light from the first light emitting element and the light from the second light emitting element travel in the light transmitting member 50, thereby attenuating luminance reduction between the first light emitting element and the second light emitting element. This can attenuate luminance non-uniformity of the light emitting device.

In the case where the light emitting device includes a light transmitting member 50, the lateral surfaces of the light transmitting member are preferably covered by the second reflecting member. This can produce a high-contrast light emitting device having a "clearly distinguishable boundary" between the emission region and non-emission region.

The light transmitting member 50 may contain a wavelength conversion material. This can facilitate color adjustments of the light emitting device. The peak emission wavelength of the wavelength conversion material contained in the light transmitting member is preferably in a range of from 610 nm to 750 nm (i.e., wavelength range of the red region). For example, the peak emission wavelength of the first light emitting element is in the wavelength range of the blue region, and the peak emission wavelength of the second light emitting element is in the wavelength range of the green region, and the wavelength conversion material in the light transmitting member has a peak emission wavelength in the wavelength range of the red region. This can improve the color reproducibility of the light emitting device. The light transmitting member may contain a single type or multiple types of wavelength conversion materials. For example, the light transmitting member may contain a green-light-emitting wavelength conversion material and a red-light-emitting wavelength conversion material. Including a green-light-emitting wavelength conversion material in the light transmitting member can facilitate color adjustments of the light emitting device. Examples of green-light-emitting wavelength conversion materials include β-SiAlON phosphors, e.g., $Si_{6-z}Al_zO_zN_{8-z}$:Eu (0<z<4.2). Examples of red-emitting wavelength conversion materials include manganese-activated potassium fluorosilicate phosphors, e.g., $K_2SiF_6$:Mn.

The wavelength conversion material may be uniformly dispersed in the light transmitting member or more localized in the vicinity of the first light emitting element than near the upper surface of the light transmitting member. In the case where the wavelength conversion material is localized in the vicinity of the first light emitting element rather than the upper surface of the light transmitting member, even if a wavelength conversion material vulnerable to moisture is used, the base material of the light transmitting member can also function as a protective layer, thereby reducing the degradation of the wavelength conversion material. As in the case of the light emitting device 1000 shown in FIG. 2B, the light transmitting member 50 may include a layer 51 which contains a wavelength conversion material, and a layer 52 which contain substantially no wavelength conversion material. The layer containing substantially no wavelength conversion material is positioned above the layer containing a wavelength conversion material in the Z direction. This allows the layer containing substantially no wavelength conversion material to also function as a protective layer, thereby reducing degradation of the wavelength conversion material. Examples of wavelength conversion materials vulnerable to moisture include manganese-activated potassium fluorosilicate phosphors. Manganese-activated potassium fluorosilicate phosphors can emit light having a relatively short spectral linewidth, and are preferable materials from the color reproducibility perspective. The term "containing substantially no wavelength conversion material" does not exclude a wavelength conversion material unavoidably mixed in. It is advantageous that a content of the wavelength conversion particles in the layer 52 is 0.05% by weight or lower.

The layer 51 containing a wavelength conversion material of the light transmitting member 50 may be a single layer or multiple layers. For example, as in the case of the light emitting device 1000A shown in FIG. 3, the light transmitting member 50 may include a first wavelength conversion layer 51A and a second wavelength conversion layer 51B which covers the first wavelength conversion layer 51A. The second wavelength conversion layer 51B may directly cover the first wavelength conversion layer 51A, or cover the first wavelength conversion layer 51A via another light transmissive layer. The first wavelength conversion layer 51A is disposed at a position closer to the first light extraction surface 201A than the second wavelength conversion layer 51B. The peak emission wavelength of the wavelength conversion material contained in the first wavelength conversion layer 51A is preferably shorter than the peak emission wavelength of the wavelength conversion material contained in the second wavelength conversion layer 51B. This allows the light from the first wavelength conversion layer 51A which has been excited by the first light emitting element to excite the wavelength conversion material in the second wavelength conversion layer 51B. This can increase the light emitted from the wavelength conversion material in the second wavelength conversion layer 51B.

The peak emission wavelength of the wavelength conversion material contained in the first wavelength conversion layer 51A is preferably 500 nm to 570 nm, and the peak emission wavelength of the wavelength conversion material contained in the second wavelength conversion layer 51B is preferably 610 nm to 750 nm. This can produce a light emitting device with high color reproducibility. Examples of wavelength conversion materials contained in the first wavelength conversion layer 51A include β-SiAlON phosphors. Examples of wavelength conversion materials contained in the second wavelength conversion layer 51B include manganese-activated potassium fluorosilicate phosphors. In the case of using a manganese-activated potassium fluorosilicate phosphor for the wavelength conversion material contained in the second wavelength conversion layer 51B, in particular, the light transmitting member 50 preferably includes a first wavelength conversion layer 51A and a second wavelength conversion layer 51B. Manganese-activated potassium fluorosilicate phosphors tend to easily reach luminance saturation. As such, positioning a first wavelength conversion layer 51A between the second wavelength conversion layer 51B and the first light emitting element 20A can attenuate the light from the first light emitting element to excessively irradiate the manganese-activated potassium fluorosilicate phosphor. This can reduce the degradation of the manganese-activated potassium fluorosilicate phosphor.

Embodiment 2

The light emitting device 2000 according to Embodiment 2 of the present disclosure will be explained based on FIG. 10. The light emitting device 2000 differs from the light emitting device 1000 according to Embodiment 1 in terms of the number of light emitting elements.

Figure 10:
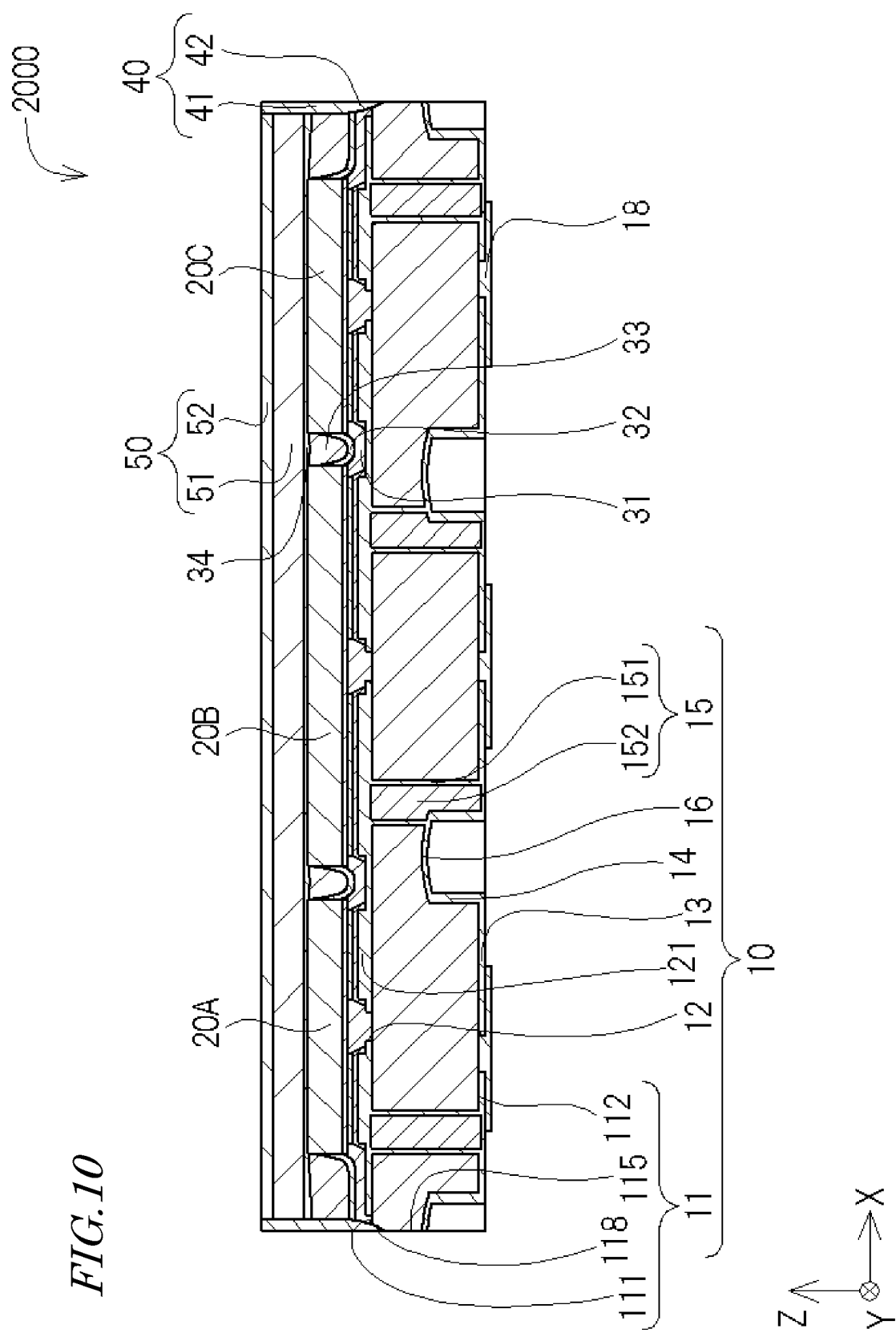
FIG. 10 is a schematic cross-sectional view of a light emitting device according to Embodiment 2.

As shown in FIG. 10, the light emitting device 2000 includes a first light emitting element 20A, a second light emitting element 20B, and a third light emitting element 20C. The peak emission wavelengths of the first light emitting element 20A, the second light emitting element 20B, and/or the third light emitting element 20C may be the same or different. The light emitting device may include four or more light emitting elements.

In the case where the first light emitting element 20A, the second light emitting element 20B, and the third light emitting element 20C are arranged in this order of a row in the X direction, the peak emission wavelength of the first light emitting element 20A and the peak emission wavelength of the third light emitting element 20C are preferably the same. In this manner, the third light emitting element 20C can compensate for a shortage of the output of the first light emitting element 20A if any. The second light emitting element 20B having a different peak emission wavelength from those of the first light emitting element 20A and the third light emitting element 20C may be positioned between the first light emitting element 20A and the third light emitting element 20C. This can reduce color non-uniformity as compared to the case where the first light emitting element 20A, the third light emitting element 20C, and the second light emitting element 20B are arranged in this order. For example, the light emitting device may include a first light emitting element having a peak emission wavelength of at least 430 nm and less than 490 nm (i.e., wavelength range of the blue region), a second light emitting element having a peak emission wavelength of at least 490 nm and 570 nm at most (i.e., wavelength range of the green region), and a third light emitting element having a peak emission wavelength of at least 430 nm and less than 490 nm (i.e., wavelength range of the blue region).

Each constituent of a light emitting device according to one embodiment of the present disclosure will be explained below.

Substrate 10

The substrate 10 is a member on which a light emitting element is mounted. The substrate 10 includes the base 11 and the first wiring portions 12.

Base 11

The base 11 can be structured with an insulating material, such as a resin or fiber-reinforced resin, ceramic, glass, or the like. Examples of resins or fiber-reinforced resins include epoxy, glass epoxy, bismaleimide triazine (BT), polyimide, or the like. The base 11 may contain white pigment such as titanium oxide. Examples of ceramic include aluminum oxide, aluminum nitride, zirconium oxide, zirconium nitride, titanium oxide, titanium nitride, or a combination of these. Among these base materials, one having a coefficient of linear expansion the same as or a similar to that of the light emitting elements is preferably used.

First Wiring Portions 12

The first wiring portions are disposed on the upper surface of the base to be electrically connected to the light emitting elements. The first wiring portions can be formed with copper, iron, nickel, tungsten, chromium, aluminum, silver, gold, titanium, palladium, rhodium, or an alloy of these. These metals and alloys may be of a single layer or multiple layers. Particularly, coper or a copper alloy is preferable from the heat dissipation perspective. As the surface layer of the first wiring portion, a layer of silver, platinum, aluminum, rhodium, gold, or an alloy of these may be disposed from the perspective of wettability of the conductive adhesive and/or reflectance.

Second Wiring Portions 13 and Third Wiring Portions 14

The second wiring portions are disposed on the lower surface of the substrate. Third wiring portions cover the inner walls of the recesses to be electrically connected to the second wiring portions. The second wiring portions and the third wiring portions can be formed using a conductive material the same as or a similar to that used of the first wiring portions.

Vias 15

The vias 15 are formed in the through holes created from the upper surface 111 to the lower surface 112 of the base 11, and are for electrically connecting the first wiring portions and the second wiring portions. The vias 15 may be structured with fourth wiring portions 151 covering the surfaces of the through holes of the base and fillings 152 provided in the fourth wiring portions 151. The fourth wiring portions 151 can be formed using a conductive material the same as or a similar to that of the first wiring portions, the second wiring portions, and the third wiring portions. The fillings 152 may be formed with a conductive or insulating material.

Insulating Film 18

The insulating film 18 secures insulation and preventing short circuits at the lower surface. The insulating film may be formed with materials used in the art. Examples of the insulating film include thermosetting resins, thermoplastic resins, and the like.

First Light Emitting Element 20A, Second Light Emitting Element 20B, and Third Light Emitting Element 20C The first light emitting element, the second light emitting element, and the third light emitting element are semiconductor elements that itself emit light in the case where a voltage is applied, for which known semiconductor elements composed of nitride semiconductors or the like can be employed. Examples of the first light emitting element, the second light emitting element, and the third light emitting element include LED chips. The first light emitting element, the second light emitting element and the third light emitting element include at least semiconductor layers, and in many cases further include element substrates. The first light emitting element, the second light emitting element, and the third light emitting element have positive and negative electrodes. The positive and negative electrodes can be structured with gold, silver, tin, platinum, rhodium, titanium, aluminum, tungsten, palladium, nickel, or their alloys. For the semiconductor materials, nitride semiconductors are preferably used. Nitride semiconductors are primarily represented by the general formula, $In_xAl_yGa_{1-x-y}N$ ($0 \leq x$, $0 \leq y$, $x+y \leq 1$). In addition, InAlGaAs-based semiconductors, InAlGaP-based semiconductors, zinc sulfide, zinc selenide, silicon carbide, and the like can be used. The element substrates for the first light emitting element, the second light emitting element, and the third light emitting element are mainly substrates for crystal growth on which semiconductor crystals can be grown to form semiconductor stacks, but may be support substrates to which the semiconductor element structures are bonded after being separated from substrates for crystal growth. Using a light transmissive element substrate can facilitate the employment of a flip-chip mounting method, as well as easily improving the light extraction efficiency. Examples of the base materials for the element substrates include sapphire, gallium nitride, aluminum nitride, silicon, silicon carbide, gallium arsenide, gallium phosphide, indium phosphide, zinc sulfide, zinc oxide, zinc selenide, diamond, and the like. Among all, sapphire is preferable. The thickness of an element substrate can be suitably selected and can be, for example, in a range of from 0.02 mm to 1 mm, preferably 0.05 mm to 0.3 mm from the perspective of element substrate strength and/or light emitting device thickness.

First Reflecting Member

The first reflecting member attenuates absorption of the light from the first light emitting element. The first reflecting member covers the upper surface of the base, and reflects the light from the first light emitting element. From the perspective of light extraction efficiency of the light emitting device, the reflectance of the first reflecting member with respect to the peak emission wavelength of the first light emitting element is preferably at least 70%, more preferably at least 80%, even more preferably at least 90%. The first reflecting member contains light reflecting particles in its base material.

Base Material for First Reflecting Member

The resin can be used for the base material of the first reflecting member, and examples include silicone resins, epoxy resins, phenol resins, polycarbonate resins, acrylic resins, or their modified resins. Among such examples, silicone resins and modified silicone resins which are highly heat resistant and light resistant are preferable. Examples of specific silicone resins include dimethyl silicone resins, phenyl methyl silicone resins, and diphenyl silicone resins.

Reflecting Particles

For reflecting particles, one among titanium oxide, zinc oxide, magnesium oxide, magnesium carbonate, magnesium hydroxide, calcium carbonate, calcium hydroxide, calcium silicate, barium titanate, barium sulfate, aluminum hydroxide, aluminum oxide, zirconium oxide, and silicon oxide can be used singly, or two or more thereof in combination. For example, one made by covering the surface of titanium oxide with a known material such as zirconia or the like may be used for the reflecting particles. The shape of the reflecting particles can be suitably selected, and may be of an irregular or crushed form. From the perspective of fluidity, however, the reflecting particles preferably has a spherical shape. The particle size of the reflecting particles, for example, is about 0.1 μm to about 0.5 μm, but the smaller the particle size, the more preferable it is for the purpose of increasing light reflection or the covering effect. Content of the reflecting particle in the light reflecting member can be suitably selected, but is preferably, for example, in a range of from 10 wt % to 80 wt %, more preferably 20 wt % to 70 wt %, even more preferably 30 wt % to 60 wt %, from the perspective of reflectance and the viscosity in the liquid state.

First Cover Member

The first cover member is a light transmitting member covering the first reflecting member and at least a portion of the first lateral surfaces while exposing the first light extraction surface. The first covering member may be formed using a light transmissive material, such as a resin. Resins that can be employed for the first cover member include silicone resins, epoxy resins, phenol resins, polycarbonate resins, acrylic resins, and their modified resins. Among such examples, silicone resins and modified silicone resins which are highly heat resistant and light resistant are preferable.

The first cover member may contain various diffusing particles. Examples of diffusing particles include silicon oxide, aluminum oxide, zirconium oxide, zinc oxide, and the like. For the diffusing particles, any one of these can be used singly, or two or more in combination. Particularly, silicon oxide having a small coefficient of linear expansion is preferable. Employing nanoparticles for the diffusing particles can increase scattering of the light from the light emitting elements while reducing the amount of the wavelength conversion material used. Nanoparticles are defined as particles having a particle size of 1 nm to 100 nm. The "particle size" in the description herein is defined, for example, by $D_{50}$.

Reflecting Particle-Containing Member

The reflecting particle-containing member is a light transmissive material containing reflecting particles. The reflecting particle-containing member may include a reflecting portion in which reflecting particles are localized, and a light transmitting portion in which reflecting particles are not localized. The light transmissive portion is located above the reflecting portion.

The base material of the reflecting particle-containing member may be formed using a material the same as or a similar to that used for the first cover member. The reflecting particles in the reflecting particle-containing member may be formed using a material the same as or a similar to that for the reflecting particles in the first reflecting member.

Second Cover Member

The second cover member covers at least a portion of the first lateral surfaces. The base material of the second cover member may be the same as or a similar to that used for the first cover member.

Second Reflecting Member

The second reflecting member surrounds the second cover member in a top view. The second reflecting member may be formed using a material the same as or a similar to that used for the first reflecting member.

Light Transmitting Member 50

The light transmitting member covers the first light extraction surface, and protects the light emitting element. The base material of the light transmitting member may be the same as or a similar to that used for the first cover member can be used.

Adhesive Layer 34

The adhesive layer bonds the light transmitting member and the first extraction surface of the first light emitting element. In the case where the first light extraction surface is covered with the second cover member, the adhesive layer bonds the light transmitting member and the second cover member. The adhesive layer is light transmissive. The adhesive layer is formed using a material the same as or a similar to that used for the first cover member.

Wavelength Conversion Material

The wavelength conversion material absorbs at least a portion of primary light emitted by the light emitting element and emits secondary light having a different wavelength from that of the primary light. The wavelength conversion material may be formed using one of the specific examples described below can be used singly, or two or more in combination. In the case where the light transmitting member is configured by multilayers of wavelength conversion layers, each of the wavelength conversion layers may contain the same or different wavelength conversion materials.

Examples of green-emitting wavelength conversion materials include yttrium aluminum garnet-based phosphors (e.g., $Y_3(Al,Ga)_5O_{12}$:Ce), lutetium aluminum garnet-based phosphors (e.g., $LU_3(Al,Ga)_5O_{12}$:Ce), terbium aluminum garnet-based phosphors (e.g., $Tb_3(Al,Ga)_5O_{12}$:Ce), silicate-based phosphors (e.g., $(Ba,Sr)_2SiO_4$:Eu), chlorosilicate-based phosphors (e.g., $Ca_8Mg(SiO_4)_4Cl_2$:Eu), β-SiAlON-based phosphors (e.g., $Si_{6-z}Al_zO_zN_{8-z}$:Eu (0<z<4.2)), SGS-based phosphors (e.g., $SrGa_2S_4$:Eu), alkaline earth aluminate-based phosphors $(Ba,Sr,Ca)Mg_xAl_{10}O_{17-x}$:Eu, Mn, and the like. Examples of yellow-emitting wavelength conversion materials include α-SiAlON-based phosphors (e.g., $M_z(Si,Al)_{12}(O,N)_{16}$ (where 0<z≤2, M is Li, Mg, Ca, Y, or lanthanide elements excluding La and Ce), and the like. Some of the green-light-emitting wavelength conversion materials described above may be yellow-light-emitting wavelength conversion materials. For example, substituting a portion of Y with Gd can shift the peak emission wavelength of an yttrium aluminum garnet-base phosphor towards longer wavelengths to thereby emit yellow light. Some of these are wavelength conversion materials can emit orange light. Examples of red-light-emitting wavelength conversion materials include nitrogen-containing calcium aluminosilicate-based phosphors, CASN-based phosphor or SCASN-based phosphor (e.g., $(Sr,Ca)AlSiN_3$:Eu). Other examples include manganese-activated fluoride phosphors (represented by the general formula (I) $A_2[M_{1-a}Mn_aF_6]$ where A is at least one selected from the group consisting of K, Li, Na, Rb, Cs, and $NH_4$, M is at least one selected from the group consisting of Group 4 elements and Group 14 elements, and a satisfying 0<a<0.2). Representative examples of manganese-activated fluoride phosphors include manganese-activated potassium fluorosilicate phosphors (e.g., $K_2SiF_6$:Mn).

Method of Manufacturing Light Emitting Device 1000

One example of a method of manufacturing a light emitting device according to one embodiment will be explained next based on FIG. 11 to FIG. 18.

Step of Providing Substrate and First Light Emitting Element

A substrate and a first light emitting element are provided. The substrate includes a base having an upper surface, and first wiring portions disposed on the upper surface. The first light emitting element has a first light extraction surface, a first electrode-formed surface located on the opposite side of the first light extraction surface, first lateral surfaces between the first light extraction surface and the first electrode-formed surface, and a pair of first electrodes on the first electrode-formed surface. In the case where the light emitting device includes multiple light emitting elements, multiple light emitting elements are provided. The step of providing a substrate may be performed before or after the step of providing a light emitting element. The present step may be performed by using the substrates obtained after dividing a substrate block into individual pieces per light emitting device, or in the state of a substrate block before being divided into individual pieces.

Step of Mounting First Light Emitting Element

Figure 11:
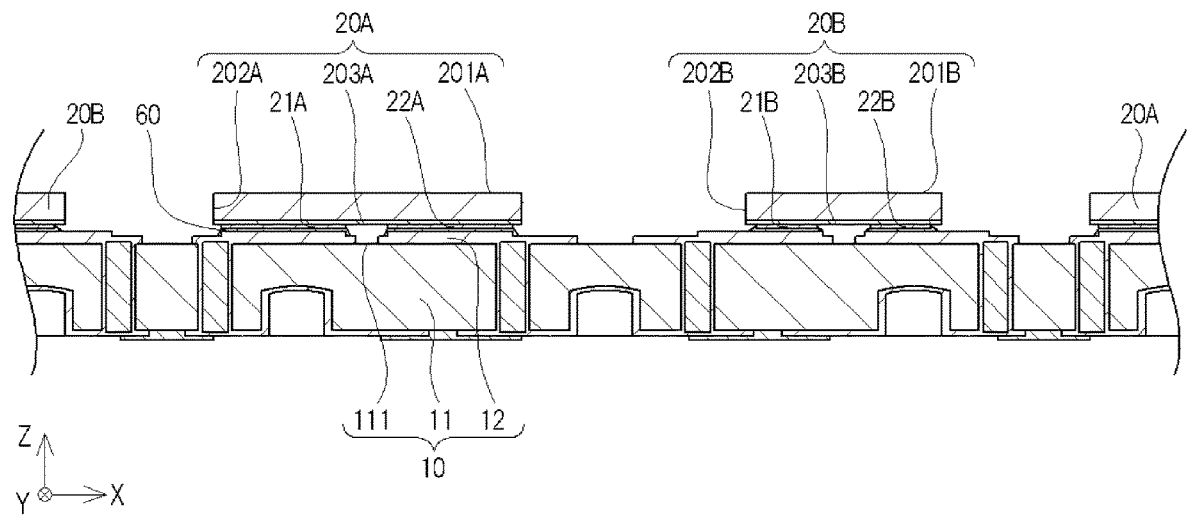
FIG. 11 is a schematic cross-sectional view illustrating a method of manufacturing a light emitting device according to Embodiment 1.

As shown in FIG. 11, the first light emitting element 20A is mounted on the first wiring portions 12 so that the first electrode-formed surface 203A of the first light emitting element 20A faces the first wiring portions 12 of the substrate 10. The first wiring portions 12 can be bonded to the first electrodes 21A and 22A using a conductive adhesive 60. In the case where the light emitting device includes a second light emitting element 20B, the second light emitting element 20B is mounted on first wiring portions 12 so that the second electrode-formed surface 203B of the second light emitting element 20B faces the first wiring portions 12 of the substrate 10.

Step of Disposing Reflecting Particle-containing Member

Figure 12:
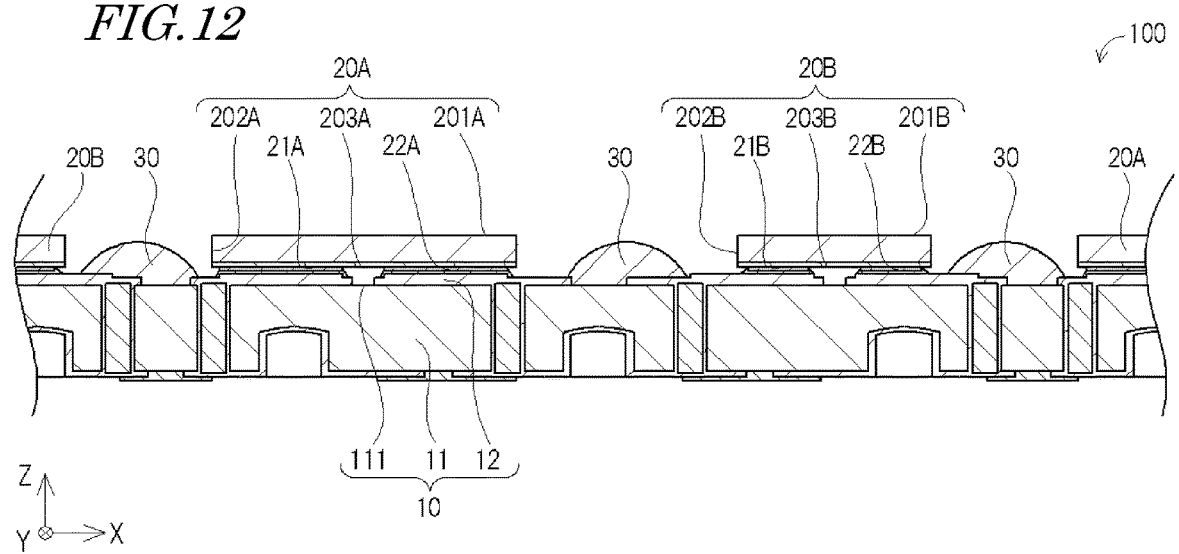
FIG. 12 is a schematic cross-sectional view illustrating a method of manufacturing the light emitting device according to Embodiment 1.

As shown in FIG. 12, a reflecting particle-containing member 30 is disposed on the upper surface 111 of the base 11 so that at least a portion of the upper surface 111 of the base 11 overlapping the first light emitting element 20A in a top view is exposed. Forming a reflecting particle-containing member 30 on the upper surface of the base while exposing a portion of the upper surface overlapping the first light emitting element in a top view can facilitate reduction of the amount of the reflecting particle-containing member as compared to the case where the reflecting particle-containing member is formed without exposing the portion of the upper surface of the base overlapping the first light emitting element. This can reduce a possibility that the reflecting particle-containing member is formed on the first light extraction surface of the first light emitting element even after the step of spreading the reflecting particle-containing member by a centrifugal force described layer. This can facilitate the extraction of the light from the first light emitting element thereby improving the light extraction efficiency of the light emitting device.

The reflecting particle-containing member 30 may be disposed in contact with, or apart from, the first lateral surfaces 202A of the light emitting element 20A. It is preferable to dispose the reflecting particle-containing member 30 so as to be spaced apart from at least a portion of the first lateral surfaces 202A. This can reduce a possibility that the reflecting particle-containing member is formed on the first light extraction surface of the first light emitting element even after the step of spreading the reflecting particle-containing member by a centrifugal force described layer. The reflecting particle-containing member may be disposed so as to be apart from the entire surfaces of the first lateral surfaces.

For the reflecting particle-containing member 30, a one-component curable resin material or a two-component curable resin material may be used. In the case of employing a two-component resin material, it is preferable to mix the base resin of the two-component resin material and reflecting particles, followed by mixing a curing agent past a prescribed time. In this manner, the air between the reflecting particles and the base resin can be eliminated. This can facilitate the settling of the reflecting particles when a centrifugal force is applied as described later. Examples of two-component resin materials include silicone resins, modified silicone resins, epoxy resins, modified epoxy resins, and the like. Two or more hours are preferably allowed to pass after mixing the resin part of the two-component resin material and the reflecting particles from the perspective of facilitating the settling of the reflecting particles. Preferably, no more than eight hours are allowed to pass from the perspective of reducing the production time. Subsequent to mixing the curing agent, the step of spreading the reflecting particle-containing member using a centrifugal force is performed before the reflecting particle-containing member is hardened.

Step of Spreading Reflecting Particle-Containing Member Using Centrifugal Force

Figure 13:
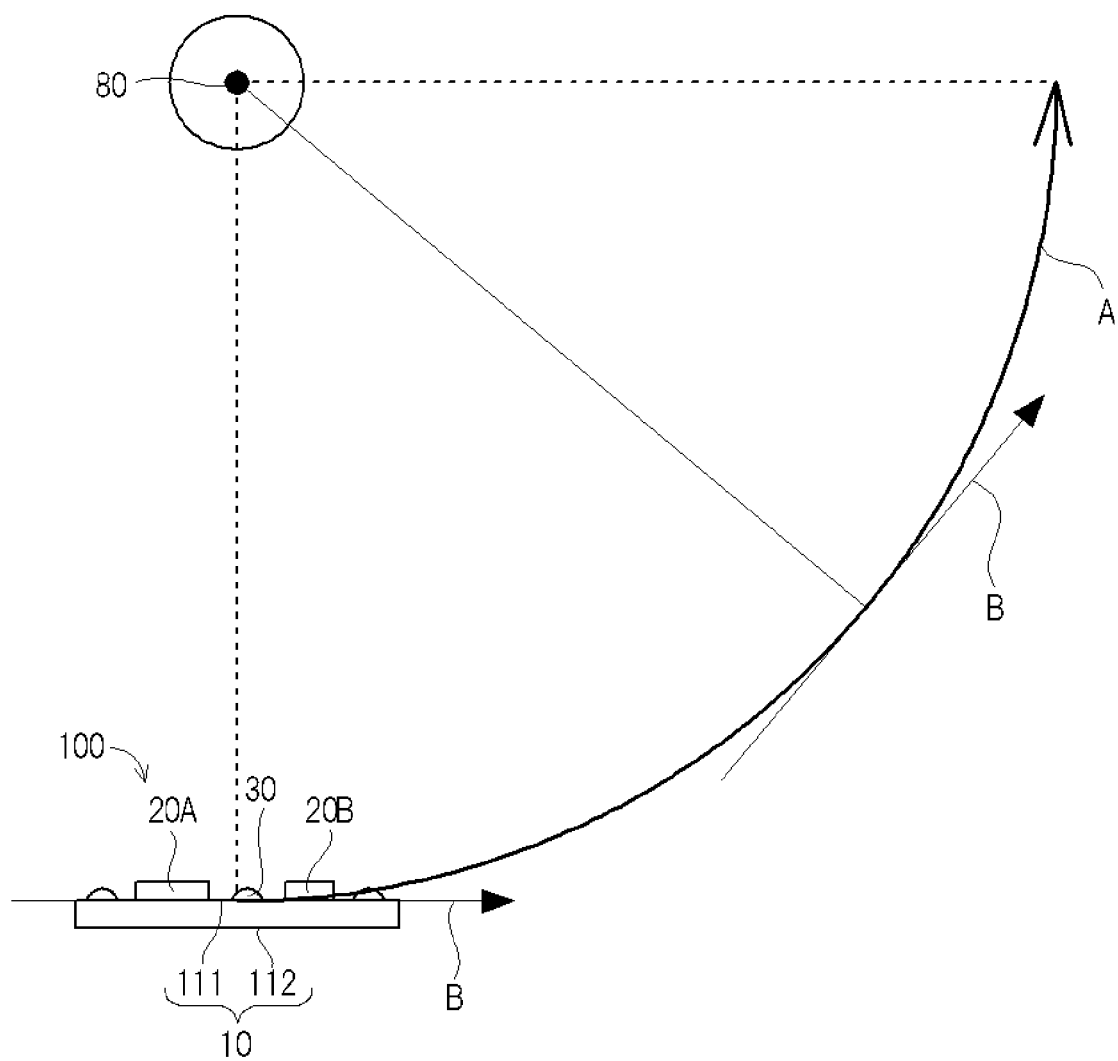
FIG. 13 is a schematic cross-sectional view illustrating a method of manufacturing the light emitting device according to Embodiment 1.

The reflecting particle-containing member 30 is spread over the area of the upper surface 111 of the base 11 where the light emitting element 20A overlaps in a top view by applying a centrifugal force. As shown in FIG. 13, an intermediate 100 including the substrate 10 and the reflecting particle-containing member 30 is rotated in the direction in which a centrifugal force is applied to the upper surface 111 of the base 11. FIG. 13 is a simplified view of the intermediate 100, and the intermediate 100 may include multiple first light emitting elements and/or second light emitting elements. The intermediate 100 is rotated about the axis of rotation 80 so that the upper surface 111 of the base is positioned inward of the lower surface 112 of the base about the axis of rotation 80. In other words, the axis of rotation 80 is located closer to the upper surface side of the intermediate 100, and the intermediate 100 is moved in direction A to revolve about the rotation of axis 80. Direction B in FIG. 13 is a direction parallel to the upper surface 111 of the base. The application of the centrifugal force to the reflecting particle-containing member 30 can spread the reflecting particle-containing member 30, thereby covering the portion of the upper surface 111 of the base which has been exposed from the reflecting particle-containing member. This can attenuate the absorption of the light from the first light emitting element by the substrate, thereby improving the light extraction efficiency of the light emitting device. The reflecting particle-containing member 30 can cover at least a portion of the upper surface 111 of the base that has been exposed from the reflecting particle-containing member, or may cover the entire area of the upper surface of the base where the first light emitting element overlaps in a top view. Spreading the reflecting particle-containing member 30 so as to cover the entire area of the upper surface of the base overlapping the first light emitting element can further attenuate the absorption of the light from the first light emitting element by the substrate.

Figure 14:
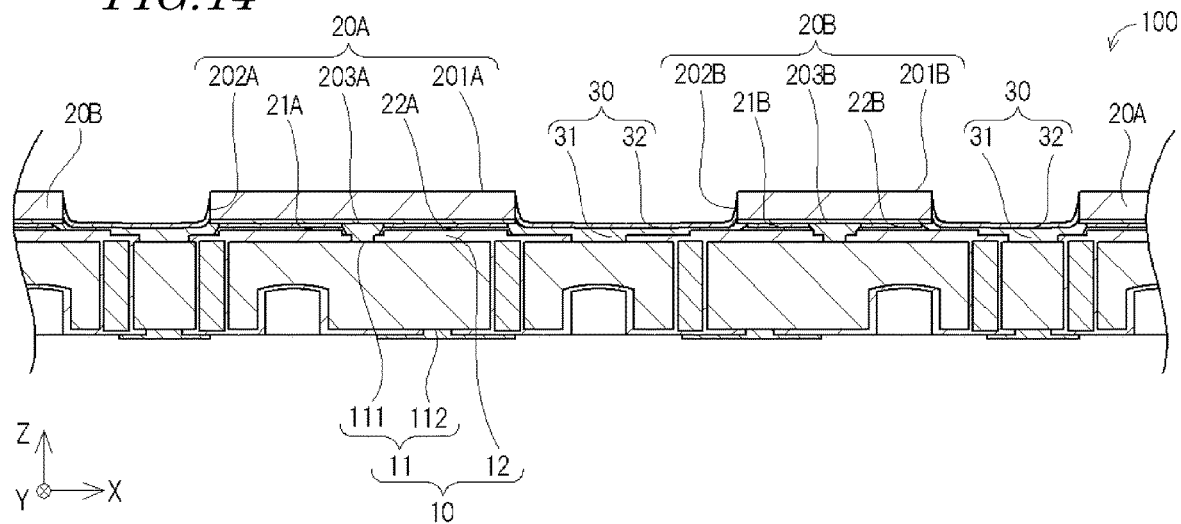
FIG. 14 is a schematic cross-sectional view illustrating a method of manufacturing the light emitting device according to Embodiment 1.

By forcibly settling the reflecting particles in the reflecting particle-containing member 30 in the minus Z direction using a centrifugal force, as shown in FIG. 14, a first reflecting member 31 in which reflecting particles are localized, and a first cover member 32 having a reflecting particle concentration lower than that of the first reflecting member while being located on the first reflecting member 31. Covering the first lateral surfaces 202A of the first light emitting element 20A with the first cover member 32 can improve the light extraction efficiency of the light emitting device. The Z plus direction along axis Z is from the lower surface 112 of the base 11 towards the upper surface 111 of the base 11, and the Z minus direction is the opposite direction. The rotational speed and the number of revolutions when rotating the intermediate 100 depend on the reflecting particle content, particle size, and the like, but the number of revolutions and the turning radius may be adjusted so that a relative centrifugal force (RCF) of, for example, 200×g is applied.

The intermediate 100 may be one obtained after dividing a substrate block per light emitting device, or in the state of a substrate block before being divided. Intermediate in the state block has a large area. In the case where the area of the intermediate is large, how the centrifugal force is applied tends to greatly differ between the center of the intermediate 100 and a position distant from the center of the intermediate 100. For this reason, the shapes of the reflecting particle-containing members in the light emitting devices might vary between those located in the center of the intermediate 100 and those located distant from the center of the intermediate 100. The variability in the shape among the reflecting particle-containing members can be reduced by increasing the turning radius. Specifically, the variability in the shape among the reflecting particle-containing members can be reduced by setting the turning radius to at least 70 times the length of the intermediate 100 arranged in the direction of rotation. In the case where the intermediate has flexibility which, for example, flexes along the circumference of the turning radius, differences in the distance from the axis of rotation 80 between the devices can be reduced.

It is preferable to cure the reflecting particle-containing member 30 while applying a centrifugal force to the reflecting particle-containing member. The reflecting particles having a smaller particle size is preferably used from the reflection perspective, but smaller particles are more difficult to settle. The reflecting particles can be settled in the Z minus direction by utilizing a centrifugal force. In order to cure the in the state where the reflecting particles are settled, it is preferable to cure the reflecting particle-containing member 30 under a centrifugal force, in other words, while rotating the intermediate 100. This can reduce a possibility of allowing the reflecting particles to move in the reflecting particle-containing member in the Z plus direction.

Examples of curing temperatures for the reflecting particle-containing member in a range of from 40° C. to 200° C. A higher curing temperature can reduce the time required to cure the reflecting particle-containing member, and thus is efficient. Considering the displacement of the axis of rotation 80 caused by thermal expansion of the metal parts of the centrifugal apparatus, the curing temperature is preferably low to the extent possible. That is, the curing temperature for the reflecting particle-containing member from the efficiency perspective is preferably 50° C. or higher. Considering the displacement of the axis of rotation 80, the curing temperature is preferably 60° C. at most. In the case of curing at 80° C. or higher, it is preferable to adjust the apparatus so that at least the metal parts of the centrifugal apparatus would not reach 80° C. or higher. It is preferable to select a resin material for the reflecting particle-containing member that can be at least semi-cured when the rotating intermediate is maintained at 40° C. or higher. The reflecting particle-containing member can be cured in the state where the reflecting particles are settled by, for example, blowing hot air, using a heat panel, and the like.

Step of Forming Second Cover Member

Figure 15:
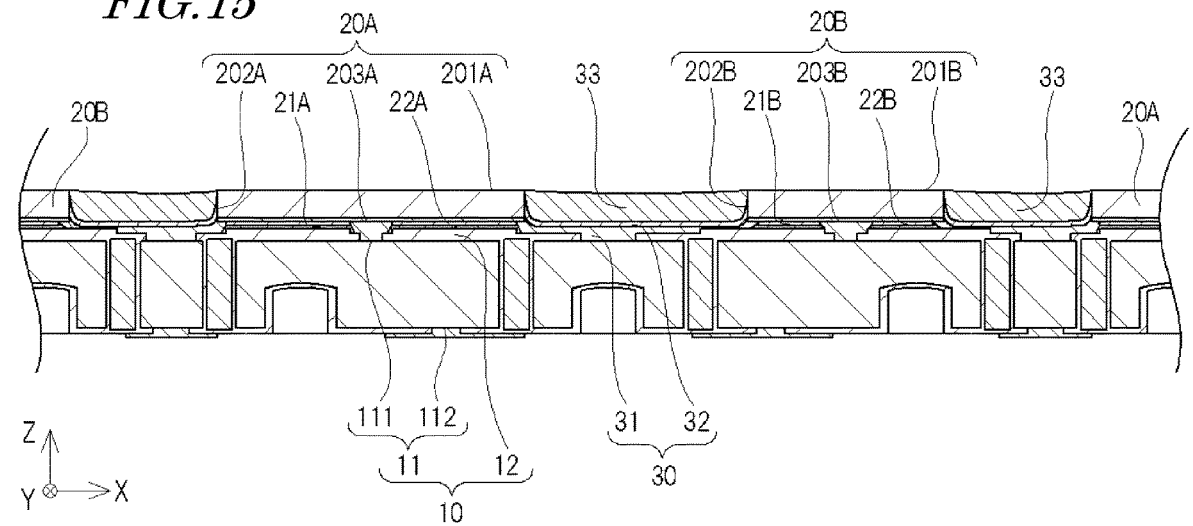
FIG. 15 is a schematic cross-sectional view illustrating a method of manufacturing the light emitting device according to Embodiment 1.

As shown in FIG. 15, a second cover member 33 covering the reflecting particle-containing member 30 is formed. The second cover member 33 covers at least a portion of the first lateral surfaces 202A of the first light emitting element 20A. The second cover member 33 may cover or expose the first light extraction surface 201 of the first light emitting element 20A. In this process, the second cover member 33 is formed, for example, by dripping a liquid resin material, which includes a base material and a wavelength conversion material, on the reflecting particle-containing member 30. Using another forming method, for example, the second cover member 33 is formed by allowing a wavelength conversion material to adhere onto the reflecting particle-containing member 30 by spraying, electrodeposition, or the like, followed by dripping a base material to impregnate the phosphor and solidifying the material. The wavelength conversion material may be localized in a portion of the second cover member or uniformly dispersed in the second cover member.

Step of Forming Light Transmitting Member

Figure 16:
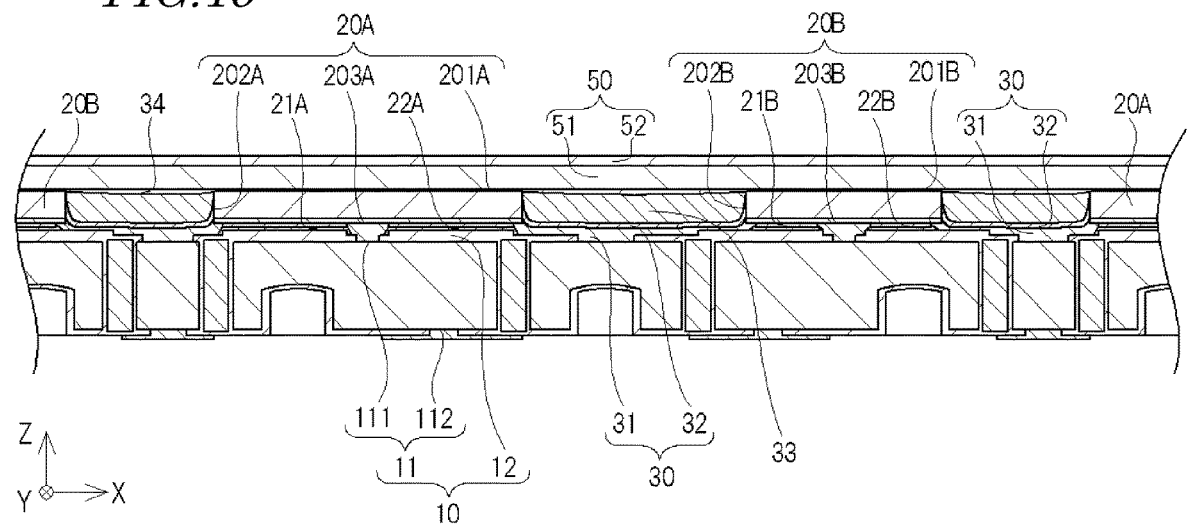
FIG. 16 is a schematic cross-sectional view illustrating a method of manufacturing the light emitting device according to Embodiment 1.

As shown in FIG. 16, a light transmitting member 50 covering the first light extraction surface 201A of the first light emitting element 20A is formed. The light transmitting member covering the first light extraction surface 201A may be formed by placing a pre-prepared light transmitting member on the first light extraction surface 201A, or by known methods such as potting. In the case of placing a light transmitting member on the first light extraction surface 201A, the first light extraction surface 201A may be covered via a light transmissive adhesive layer 34.

Step of Forming Groove

Figure 17:
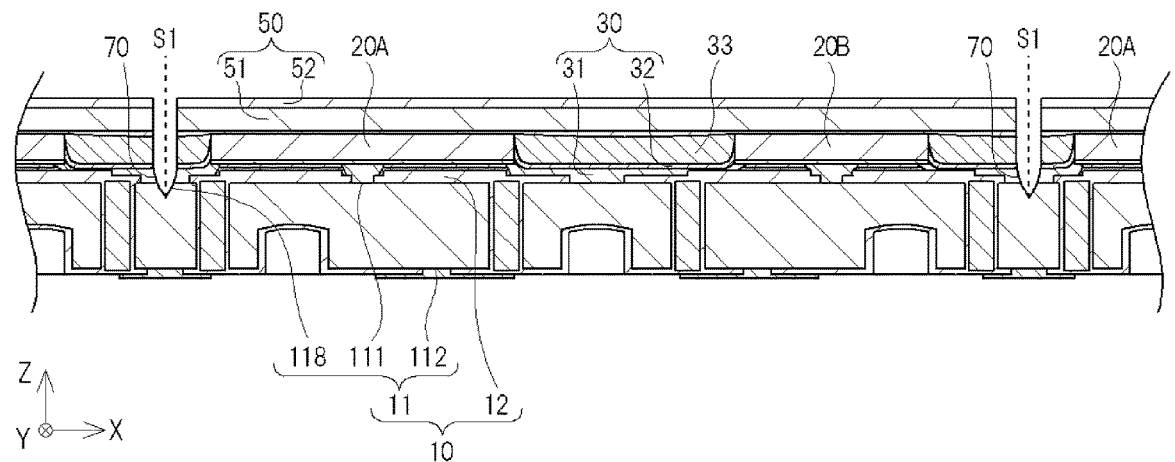
FIG. 17 is a schematic cross-sectional view illustrating a method of manufacturing the light emitting device according to Embodiment 1.

As shown in FIG. 17, a groove 70 is created which passes through the second cover member 33 and at least is in contact with the reflecting particle-containing member 30. The groove 70 is created to surround the first light emitting element 20A in a top view. In the case where the light emitting device includes a second light emitting element 20B, the groove 70 is created to surround the first light emitting element 20A and the second light emitting element 20B in a top view. The reflecting particle-containing member 30 may include a first reflecting member 31 in which the reflecting particles are localized, and a first cover member 32 having a reflecting particle concentration lower than the first reflecting member 31 and located on the first reflecting member 31. In this case, the groove 70 passes through the first reflecting member 31 and the second cover member 33, and is in contact at least with the first reflecting member 31. The groove 70 may pass through the first reflecting member 31, but does not have to pass through it. In the case where the groove 70 passes through the first reflecting member 31, the groove 70 may be in contact with the upper surface 111 of the base. The portion of the groove on the upper surface 111 of the base 11 is also referred to an depression 118. In the case where the light emitting device includes a light transmitting member 50, the groove 70 is created to pass through the light transmitting member 50. The groove can be created by known methods, such as blade dicing, laser dicing, or the like. In the description herein, one created by etching is also referred to as a groove. The groove has a narrow-width portion and a wide-width portion where the narrow-width portion is located on the Z minus side and the wide-width portion is located on the Z plus side. The narrow-width portion and the wide-width portion can be formed by the shape of a blade or the like.

Step of Forming Second Reflecting Member

Figure 18:
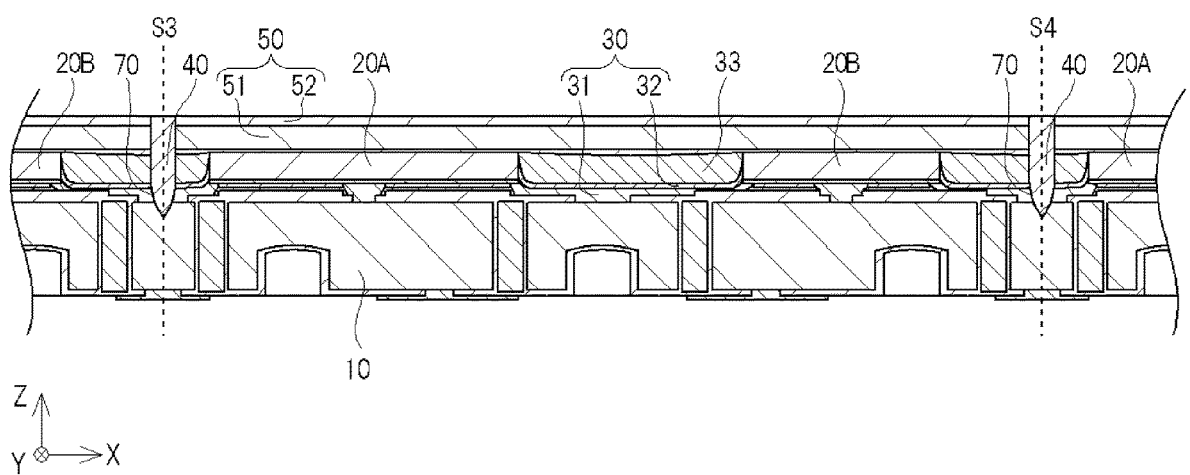
FIG. 18 is a schematic cross-sectional view illustrating a method of manufacturing the light emitting device according to Embodiment 1.

As shown in FIG. 18, a second reflecting member 40 is formed which is in contact with the second cover member 33 and the reflecting particle-containing member 30. The second reflecting member 40 surrounds the first light emitting element 20A in a top view. In the case where the light emitting device includes a second light emitting element 20B, the second reflecting member 40 is formed to surround the first light emitting element 20A and the second light emitting element 20B in a top view. The second reflecting member 40 can be formed by supplying an uncured resin material to-be the second reflecting member in the groove 70, and curing the uncured material to-be the second reflecting member. Methods of supplying an uncured material for the second reflecting member in the groove 70 include known methods, such as transfer molding, injection molding, compression molding, potting, or the like. The second reflecting member 40 may be partially removed by using known methods, such as grinding, in order to adjust the thickness. In the case where the light emitting device includes a light transmitting member, the second reflecting member may be formed to cover the upper surface and/or the lateral surfaces of the light transmitting member. In the case where the second reflecting member is formed to cover the entire upper surface of the light transmitting member, the second reflecting member is partially removed to at least partially expose the light transmitting member from the second reflecting member. The light transmitting member may be partially removed when partially removing the second reflecting member 40 in order to adjust the thickness. The second reflecting member and the light transmitting member may be partially removed so that the upper surface of the second reflecting member is coplanar with the upper surface of the light transmissive member.

Step of Separating into Individual Devices

In the case where the intermediate 100 is a substrate block, as shown in FIG. 18, the second reflecting member 40 and the substrate 10 are partially removed along broken line $S_3$ and broken line $S_4$, so that an individual light emitting device is separated. For example, light emitting devices are separated into individual devices by cutting the second reflecting member 40 and the substrate 10 by blade dicing, laser dicing, or the like.

The light emitting device 1000 is manufactured by performing the steps described above.

The light emitting devices according to the embodiments of the present disclosure can be utilized in backlight devices for liquid crystal displays, various types of lighting fixtures, large-sized displays, various display devices, such as advertising boards and destination signs, projectors, as well as image reading devices for digital video cameras, facsimiles, copiers, scanners or the like.

While certain embodiments of the present invention have been described above, it will be apparent to those skilled in the art that the invention may be modified in numerous ways and may assume many embodiments other than those specifically described above. Accordingly, it is intended by the appended claims to cover all modifications of the invention that fall within the spirit and scope of the invention.

What is claimed is:

1. A light emitting device comprising:
  a substrate including a base having an upper surface, and wiring portions disposed on the upper surface,
  a first light emitting element disposed on the wiring portions, the first light emitting element having a light extraction surface, an electrode-formed surface located on an opposite side of the light extraction surface, lateral surfaces located between the light extraction surface and the electrode-formed surface, and a pair of electrodes formed on the electrode-formed surface, the electrode-formed surface facing the wiring portions, and
  a first reflecting member containing reflecting particles and covering the upper surface of the base while exposing the light extraction surface,
  a first cover member having a lower concentration of reflecting particles than a concentration of the reflecting particles in the first reflecting member, and covering the first reflecting member and at least a portion of the lateral surfaces of the first light emitting element while exposing the light extraction surface,
  a second cover member covering at least a portion of the lateral surfaces of the first light emitting element, and
  a second reflecting member surrounding the second cover member in a top view while being in contact with the second cover member and the first reflecting member, wherein the second reflecting member has a narrow-width portion being in contact with the first reflecting member and a wide-width portion located above the narrow-width portion in a cross-sectional view.

2. The light emitting device according to claim 1, further comprising a second light emitting element having a peak emission wavelength different from a peak emission wavelength of the first light emitting element.

3. The light emitting device according to claim 1, wherein the first cover member is in contact with the second reflecting member.

4. The light emitting device according to claim 3, wherein
a thickness of the first cover member in a direction from the electrode-formed surface toward the light extraction surface at a portion being in contact with the first light emitting element is larger than a thickness of the first cover member in a direction from the electrode-formed surface toward the light extraction surface at a portion being in contact with the second reflecting member.

5. The light emitting device according to claim 1, wherein a depression is formed along an outer perimeter of the upper surface of the base, and a portion of the second reflecting member is disposed in the depression.

6. The light emitting device according to claim 1, wherein an outer edge of the base is coplanar with an outer lateral surface of the second reflecting member.

7. The light emitting device according to claim 1, wherein the first light emitting element includes a semiconductor layer, and a lateral surface of the semiconductor layer is covered by the first reflecting member.

8. The light emitting device according to claim 1, further comprising a light transmitting member covering the light extraction surface.

* * * * *